US011282837B2

(12) United States Patent
Franco et al.

(10) Patent No.: US 11,282,837 B2
(45) Date of Patent: Mar. 22, 2022

(54) PMOS TRANSISTOR INCLUDING LOW THERMAL-BUDGET GATE STACK

(71) Applicant: IMEC vzw, Leuven (BE)

(72) Inventors: Jacopo Franco, Heverlee (BE); Hiroaki Arimura, Leuven (BE); Benjamin Kaczer, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/688,776

(22) Filed: Nov. 19, 2019

(65) Prior Publication Data

US 2020/0176446 A1 Jun. 4, 2020

(30) Foreign Application Priority Data

Nov. 30, 2018 (EP) ..................... 18209442

(51) Int. Cl.
*H01L 21/02* (2006.01)
*H01L 23/367* (2006.01)
(Continued)

(52) U.S. Cl.
CPC ...... *H01L 27/0922* (2013.01); *H01L 21/0214* (2013.01); *H01L 21/02164* (2013.01);
(Continued)

(58) Field of Classification Search
CPC ....... H01L 21/02362; H01L 21/823857; H01L 21/0214; H01L 21/02181; H01L 21/02178;
(Continued)

(56) References Cited

U.S. PATENT DOCUMENTS 8,003,507 B2 * 8/2011 Chen ................... H01L 29/4966
438/592
8,115,511 B2 * 2/2012 Or-Bach .......... H03K 19/17736
326/39

(Continued)

FOREIGN PATENT DOCUMENTS

EP 2 112 686 A2 10/2009
EP 2 112 686 A3 12/2009

OTHER PUBLICATIONS

Elke Erben et al., "Work Function Setting in High-k Metal Gate Devices" In: "Complementary Metal Oxide Semiconductor", Aug. 1, 2018, InTech.

(Continued)

*Primary Examiner* — Nikolay K Yushin
(74) *Attorney, Agent, or Firm* — Knobbe, Martens, Olson & Bear, LLP

(57) ABSTRACT

A p-channel metal-oxide-semiconductor (pMOS) transistor including a gate stack which includes: a silicon oxide comprising dielectric interlayer on a substrate, wherein the dielectric interlayer has a thickness below 1 nm; a high-k dielectric layer having a higher dielectric constant compared to the dielectric interlayer; a first dipole-forming capping layer between the dielectric interlayer and the high-k dielectric layer and in direct contact with the dielectric interlayer, for shifting down a high-K bandgap of the high-k dielectric layer with relation to a valence band of the substrate, where the first dipole-forming capping layer has a thickness below 2 nm; at least one work function metal above the high-k dielectric layer. Advantageously, the pMOS transistor includes low negative bias temperature instability (NBTI) and therefore high reliability without the use of a reliability anneal which makes the pMOS transistor suitable for use as back end of line (BEOL) devices.

25 Claims, 12 Drawing Sheets

(51) Int. Cl.
*H01L 27/092* (2006.01)
*H01L 29/00* (2006.01)
*H01L 21/8238* (2006.01)
*H01L 29/51* (2006.01)

(52) U.S. Cl.
CPC .. *H01L 21/02178* (2013.01); *H01L 21/02181* (2013.01); *H01L 21/02362* (2013.01); *H01L 21/823857* (2013.01); *H01L 23/367* (2013.01); *H01L 27/092* (2013.01); *H01L 29/513* (2013.01)

(58) Field of Classification Search
CPC ......... H01L 21/02164; H01L 21/28194; H01L 23/367; H01L 23/3121; H01L 23/3192; H01L 23/564; H01L 27/0922; H01L 27/092; H01L 27/1203; H01L 27/0924; H01L 27/228; H01L 29/517; H01L 29/4966; H01L 29/513
See application file for complete search history.

(56) References Cited

U.S. PATENT DOCUMENTS

| | | | |
|---|---|---|---|
| 8,183,642 B2 | 5/2012 | Park et al. | |
| 8,258,546 B2 | 9/2012 | Hung et al. | |
| 9,281,310 B2* | 3/2016 | Ji | H01L 21/28202 |
| 10,680,108 B2* | 6/2020 | Arimura | H01L 29/0649 |
| 2010/0041223 A1* | 2/2010 | Chen | H01L 21/28088 438/591 |
| 2010/0259296 A1* | 10/2010 | Or-Bach | H03K 19/17736 326/38 |
| 2013/0078773 A1 | 3/2013 | Xu et al. | |
| 2015/0129973 A1* | 5/2015 | Ji | H01L 29/4966 257/369 |
| 2016/0197073 A1 | 6/2016 | Ando et al. | |
| 2017/0162686 A1* | 6/2017 | Arimura | H01L 29/512 |

OTHER PUBLICATIONS

The Extended European Search Report for Application No. 18209442.5-1212 dated May 13, 2019.

\* cited by examiner

PMOS TRANSISTOR INCLUDING LOW THERMAL-BUDGET GATE STACK

CROSS-REFERENCE TO RELATED APPLICATIONS

This application claims foreign priority to European Application No. EP 18209442.5, filed Nov. 30, 2018, the content of which is incorporated by reference herein in its entirety.

BACKGROUND

Field

This disclosed technology generally relates to metal oxide field effect transistors, and more particularly to low thermal-budget pMOS gate stack designs with sufficiently small negative bias temperature instability for reliable device operation at ultra-thin effective oxide thicknesses.

Description of the Related Technology

There are many different architectures for metal oxide semiconductor field effect (MOSFET) transistors. A gate first integration initially includes deposition of a high-k material and a metal gate to form the gate stack. This integration further includes deposition of a source and a drain after forming the high-k material and the metal gate. In this process the gate stack including the high-k material and the metal gate undergoes a source/drain (S/D) activation anneal. This source/drain activation anneal can be done at about 1100° C. and can be detrimental for the metal work function (i.e., threshold voltage (Vth) control).

SUMMARY OF CERTAIN INVENTIVE ASPECTS

It is an object of embodiments of the present disclosure to provide reliable pMOS gate stacks and methods for producing them. It is a further object of embodiments of the present disclosure to provide reliable CMOS devices and methods for producing them.

The above objective is accomplished by a method and device according to the present disclosure. As described herein, a gate stack refers to a stack including a gate dielectric (stack) formed above a channel and a gate electrode formed above the gate dielectric (stack) for influencing the channel.

In a first aspect, embodiments of the present disclosure relate to a p-channel metal-oxide-semiconductor transistor including a gate stack. The gate stack includes: a silicon oxide including dielectric interlayer on a substrate, wherein the dielectric interlayer has a thickness below 1 nm; a high-k dielectric layer having a higher dielectric constant compared to the dielectric interlayer; a first dipole-forming capping layer between the dielectric interlayer and the high-k dielectric layer and in direct contact with the dielectric interlayer, for shifting down the bandgap of the high-k dielectric layer with relation to the valence band of the substrate, wherein the first dipole-forming capping layer has a thickness below 2 nm; at least one work function metal above the high-k dielectric layer.

Direct contact includes in direct physical contact, so no other layers are present in between the first dipole-forming capping layer and the dielectric layer.

Advantageously, the reliability is improved by introducing a first dipole-forming capping layer between the dielectric interlayer and the high-k dielectric layer, for shifting down the high-k dielectric layer bandgap with relation to a valence band of the substrate. This improved reliability because the thickness of the dielectric interlayer is below 1 nm, and therefore the traps in the (thicker) high-k dielectric layer affect the device reliability more as compared to the traps in the (thinner) dielectric interlayer. The thickness of the high-k dielectric layer may for example be above 1 nm, or even above 1.5 nm, or even up to 3 nm, such as for example 2 nm.

Further advantageously, p-channel metal oxide semiconductor (pMOS) transistor Negative-BTI (NBTI) reliability can be achieved in a low thermal budget process flow, without requiring a high-temperature "reliability anneal" which can be incompatible with certain CMOS integrations as, e.g., sequential three dimensional (3D) stacking of transistor tiers. The improvement can be attributed to the formation of interface dipoles which displace the energy level of the high-k traps with respect to the silicon (Si) valence band.

In some embodiments, the thickness of the dipole forming capping layer is smaller than 1 nm. Above this thickness, the dipole effect may not increase while thickness continues to increase.

In some embodiments, the substrate may be a silicon substrate, a silicon germanium (SiGe) substrate, a germanium (Ge) substrate, or a III-V compound substrate (such as, e.g., indium gallium arsenic (InGaAs), indium arsenic (InAs), gallium arsenic (GaAs), gallium antimony (GaSb), indium phosphide (InP), gallium nitride (GaN)).

In some embodiments, the dielectric layer is a silicon dioxide ($SiO_2$) or silicon oxide nitride (SiON) layer.

The dielectric layer may be a silicon oxide ($SiO_x$) layer which can be substantially stoichiometric (i.e. x is approximately equal to 2) and not necessarily is completely stoichiometric (i.e., some unit cells may not have the exact proportion of 2 oxygen atoms per each Si atom).

In some embodiments, the $SiO_2$ interlayer may be doped with nitrogen (e.g., to make it a better diffusion barrier against the diffusion of doping atoms from the substrate).

In some embodiments, the first dipole-forming capping layer is an $Al_2O_3$ layer.

In some embodiments, the high-k dielectric layer is a $HfO_2$ layer.

In some embodiments, the device may include to a complementary metal-oxide-semiconductor device, the complementary metal-oxide-semiconductor comprising a pMOS transistor in accordance with embodiments of the present disclosure and an n-channel metal-oxide-semiconductor (nMOS) transistor.

A metal-oxide-semiconductor device according embodiments of the present disclosure may include an nMOS transistor which includes a gate stack on an active region in the substrate, wherein the gate stack of the nMOS transistor includes a second dipole-forming capping layer between an interfacial dielectric layer and a high-k dielectric layer having a high-k bandgap, wherein the second dipole-forming capping layer is suitable for shifting up the high-k bandgap with relation to the conduction band of the substrate.

Advantageously, by shifting up the high-k bandgap with relation to the conduction band of the substrate, the energy barrier for the electron trapping from the semiconductor channel can be increased.

In some embodiments, the second dipole-forming capping layer is a transition metal oxide layer or a transition metal silicate layer.

The second dipole-forming capping layer may comprise lanthanum oxide ($La_xO_z$), where x and z are each greater than 0 or it may comprise lanthanum silicon oxide ($La_xSi_yO_z$), where x,y and z are each greater than 0.

In some embodiments, the second dipole-forming capping layer of the nMOS transistor is $La_xSi_yO_z$ (with x and z greater than 0, and with y greater than or equal to 0, e.g. $La_2O_3$), and the interfacial dielectric layer of the nMOS transistor is $SiO_2$ and the high-k dielectric layer of the nMOS transistor is $HfO_2$ and, the dielectric interlayer of the pMOS transistor is $SiO_2$, and the high-k dielectric layer of the pMOS transistor is $HfO_2$, and the first dipole-forming capping layer of the pMOS transistor is $Al_2O_3$.

Embodiments of the present disclosure may relate to a semiconductor device including a three-dimensional stack of transistors, the stack comprising a pMOS transistor according to embodiments of the present invention, or a CMOS device according to embodiments of the present invention, in a first layer, stacked onto one or more transistors in a second layer.

In some embodiments, pMOS transistors, or CMOS devices may be implemented in the back-end-of-line (BEOL).

A semiconductor device according to embodiments of the present invention may comprise a memory array and a pMOS transistor or a CMOS device, according to embodiments of the present invention, wherein the pMOS transistor and/or the CMOS device are deposited on top of the memory array.

In another aspect of the present disclosure provides a method for forming a p-channel metal-oxide-semiconductor gate stack. The method includes: forming a silicon oxide including dielectric interlayer with a thickness below 1 nm on a substrate; depositing a first dipole-forming capping layer with a thickness below 2 nm in direct contact with the dielectric interlayer; depositing a high-k dielectric layer above the first dipole-forming capping layer having a high-K bandgap, wherein the first dipole-forming capping layer is adapted for shifting down the high-K bandgap with relation to the valence band of the substrate; depositing one or more work function metals above the high-k dielectric layer.

Advantageously, a functional reliable pMOS gate stack can be obtained according to various embodiments without use of a high temperature reliability anneal after the gate stack deposition. The high temperature post deposition reliability anneal step may be omitted because the reliability is improved by the first dipole-forming capping layer between the dielectric interlayer, with thickness below 2 nm, and the high-k dielectric layer. Methods in accordance with embodiments of the present disclosure are, therefore, compatible with certain CMOS integrations. Thus, according to some embodiments, a method of fabricating a semiconductor device comprises completing fabrication without subjecting the pMOS gate stack to a temperature greater than 800° C.

In some embodiments, the method can be implemented as part of a high-k dielectric last replacement metal gate process, wherein after complete removal of the dummy gate stack, a method can be applied (i.e. the dielectric layer is formed, the first dipole forming capping layer is deposited, and the high-k dielectric layer is deposited), for replacing the dummy gate with a pMOS gate stack in accordance with embodiments of the present disclosure. After applying the pMOS gate stack, one or more work function setting metals may be deposited. Advantageously, neither the gate dielectric, nor the work function setting metals are exposed to a high temperature reliability anneal step.

Embodiments of the present disclosure provide a method for forming a complementary metal oxide semiconductor device, the method including providing a nMOS gate stack and applying the method steps of a method according to the present disclosure for forming a pMOS gate stack.

In some embodiments, the method for forming the CMOS device comprises providing the nMOS gate stack and the pMOS gate stack using similar steps for forming the pMOS stack to also form the nMOS stack. These steps can include: forming a dielectric interlayer with a thickness below 1 nm on the semiconductor substrate for the nMOS gate stack, while also forming the dielectric interlayer for the pMOS gate stack, depositing a second dipole-forming capping layer above the dielectric interlayer for the nMOS gate stack and above the first dipole-forming capping layer for the pMOS gate stack, depositing a high-k dielectric layer above the second dipole-forming capping layer of the nMOS gate stack, while depositing the high-k dielectric layer of the pMOS transistor gate stack, where the second dipole-forming capping layer is adapted for shifting up the high-K bandgap with relation to the conduction band of the semiconductor substrate, depositing one or more work function metals.

In some embodiments, the first dipole-forming capping layer can be prevented from forming on the dielectric interlayer of the nMOS transistor gate stack. Advantageously, the second dipole-forming capping layer may be provided above the first dipole-forming capping layer in the pMOS transistor gate stack without significantly reducing the reliability of the pMOS transistor gate stack.

Embodiments of the present disclosure may relate to a method for providing a three-dimensional stack of transistors, the method including forming pMOS transistor gate stacks in a plurality of layers for forming the three-dimensional stack of transistors. The pMOS transistor gate stacks may be formed using method steps in accordance with embodiments of the present invention.

Methods according to embodiments of the present disclosure may be applied for forming pMOS transistor gate stacks to be integrated within the BEOL. Methods according to embodiments of the present disclosure may also be applied for forming pMOS transistor gate stacks on top of a memory tier.

Particular aspects of this disclosure are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

Figure 1:
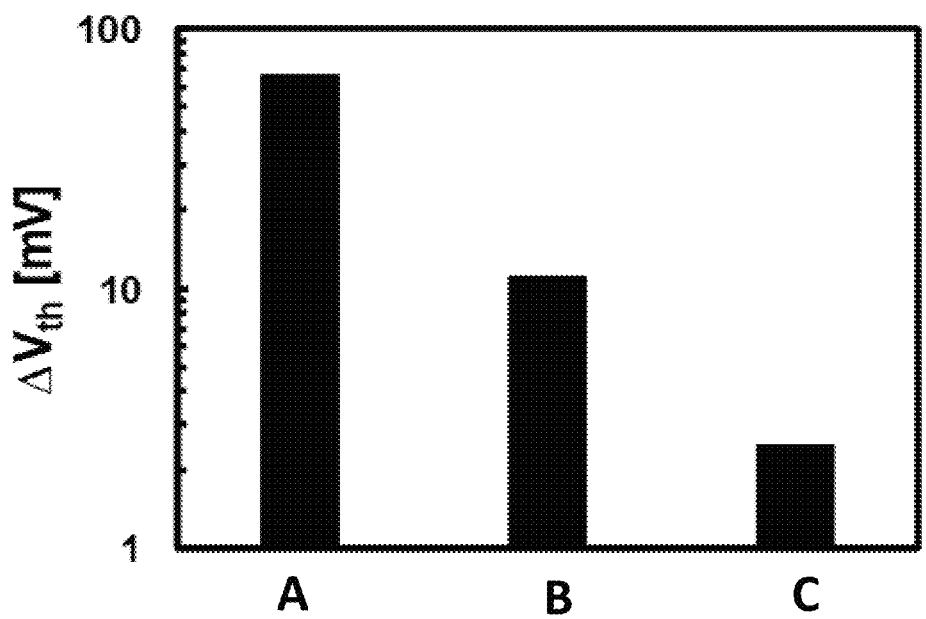
FIG. 1 shows the threshold voltage instability of a gate stack before and after a reliability anneal.

Replacement metal gate (RMG) integration, also known as a gate-last integration, is a MOSFET process architecture where the gate stack is formed after forming the source and the drain, thereby forming the high-k material and the metal gate after the S/D activation anneal. In RMG, negative bias temperature instability (NBTI) has been observed in p-channel metal oxide semiconductor (pMOS) transistors and can be attributed to the presence of hole traps in native Si dioxide. An additional anneal can be performed after the gate stack deposition to mitigate the effects of NBTI. This anneal is referred to as a reliability anneal (also referred to as a post-deposition anneal or a post metal anneal). The reliability anneal can be performed at temperatures lower than the S/D activation anneal, but typically at temperature above 800° C. In RMG, the reliability anneal can be done to increase functionality and reliability of the gate stack by curing dielectric defects. FIG. 1 shows an example threshold voltage instability ($\Delta Vth$), without reliability anneal (A), after a first reliability anneal (B), and after a second reliability anneal (C). It is appreciated from the decrease in threshold voltage instability that performing the reliability anneal can improve reliability. In the example illustrated in FIG. 1, the reliability anneal was a rapid anneal step that lasted about 1 second and was performed at 900° C. Application of a rapid anneal step can mitigate NBTI which can increase pMOS reliability. However, the rapid anneal step can make the RGB architecture unsuitable for a top tier device in stacked CMOS technologies as the back end of line (BEOL) or bottom tier devices can be harmed by the high temperatures.

It has been discovered that MOSFETs used in CMOS technology can exhibit undesirable bias temperature instability (BTI) of their electrical characteristics based on the presence of defects in a gate dielectric stack, which can trap/de-trap channel carriers and affect the device electrostatics which can induce performance degradation.

BTI mitigation schemes may be applied during device engineering/fabrication, as an excessive device instability may result circuit failure at the product level. Similar to pMOS transistors, n-channel MOS (nMOS) transistors exhibit Positive-BTI (PBTI) which can be attributed to electron traps within the high-k dielectrics (such as for example $HfO_2$). With the scaling of oxide thickness, BTI can be exacerbated due to increasing oxide electric fields ($E_{ox}$). The BTI mitigation can include:

1) limiting the scaling of the $SiO_2$ interfacial layer (IL), to mitigate the $E_{ox}$; and, especially, 2) applying rapid thermal anneals (so-called "reliability anneal," at greater than 800° C. temperature, for 1-2 seconds) after the dielectric deposition (even in a replacement gate process flow) to minimize oxide defect densities. Thermal-budget limitations in some technologies (e.g. sequential 3D integration, where multiple semiconductor device tiers are stacked on top of each other; Ge/III-V channel MOS technology, etc.) can impede the use of high-temperature reliability anneals.

For the nMOS PBTI, the use of an atomic layer deposition (ALD)-deposited inter-layer which form dipoles between $SiO_2$ and $HfO_2$ can make defect levels in $HfO_2$ less energetically favorable for trapping channel electrons (see for example the U.S. Patent Application Publication 2017/0162686 titled "Field-effect transistor comprising germanium and manufacturing method thereof"). pMOS transistors with gate stacks with high thermal budget can be advantageous.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosed technology.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the technology described herein are capable of operation in other orientations than described or illustrated herein.

The term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed technology requires more features than are expressly recited in each claim. Rather, as the following claims reflect, disclosed aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosed technology may be practiced without these specific details. In other instances, well-known methods, structures and techniques have not been shown in detail in order not to obscure an understanding of this description.

A high-k dielectric is understood to mean a dielectric with a higher dielectric constant than $SiO_2$. The dielectric constant of a high-k dielectric may, for example, be between 10 and 50. An example high-k dielectric material which can be used as gate dielectric is a Hf-based material such as $HfO_2$, which has a k-value of about 25.

Figure 2:
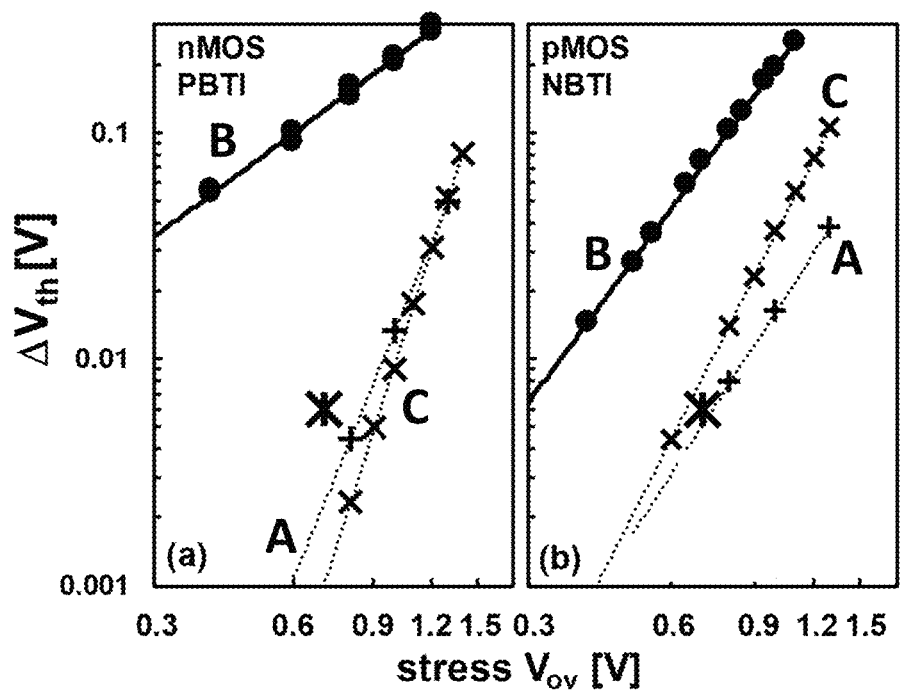
FIG. 2 shows two graphs illustrating threshold voltage changes for nMOS and for pMOS gate stacks, with and without use of a reliability anneal, as compared to an exemplary threshold voltage of a typical device.

The graphs in FIG. 2 illustrate improvements in reliability for example nMOS transistors and for example pMOS transistors including gate stacks. In these graphs an improvement in the BTI can be attributed to a high temperature anneal. The left graph shows the stability of the nMOS transistor threshold voltage Vth and the right graph shows the stability of the pMOS transistor threshold voltage Vth. Ideally, the threshold voltage should be stable when applying a given operating voltage.

Curves A (of which measurement points are indicated with a "+" symbol) show the threshold voltage instability ($\Delta V_{th}$) of an example gate stack. Curves B (indicated with the circles) show the $\Delta V_{th}$ of an nMOS transistor and a pMOS transistor when a high temperature reliability anneal has not been performed. Curves C (indicated with the "x" symbol) show the threshold voltage instability ($\Delta V_{th}$) for an nMOS transistor and a pMOS transistor with a gate stack when a high temperature reliability anneal has been performed. The big star illustrates an achievable $\Delta V_{th}$ that can provide adequate stable reliability. As can be seen from these graphs the reliability of the nMOS transistor and pMOS transistor including a gate stack can improve by applying a high temperature reliability anneal. However, it has also been discovered that the gap between curves B and C for the pMOS transistors can be bridged without applying a high temperature reliability anneal.

Figure 3:
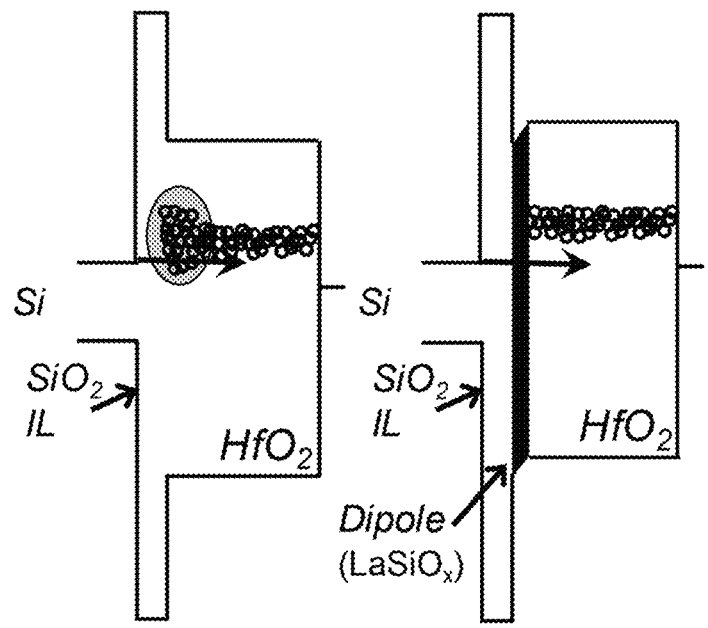
FIG. 3 shows the energy levels of an exemplary nMOS transistor gate stack before and after inserting a dipole layer.

Further, in nMOS transistors, the BTI may be mitigated by providing a gate stack of which the schematic drawings in FIG. 3 illustrate the energy levels. This solution is also proposed in US20170162686. The left drawing illustrates a gate stack including a Si substrate, a $SiO_2$ layer and a $HfO_2$ layer. The right drawing illustrates a gate stack of a Si substrate, a $SiO_2$ layer, a $LaSiO_x$ dipole layer, and a $HfO_2$ layer. The schematic drawings in FIG. 3 illustrate how the energy levels of the traps in the high-k dielectric material can be shifted by introducing the $LaSiO_x$ dipole-forming layer.

Figure 4:
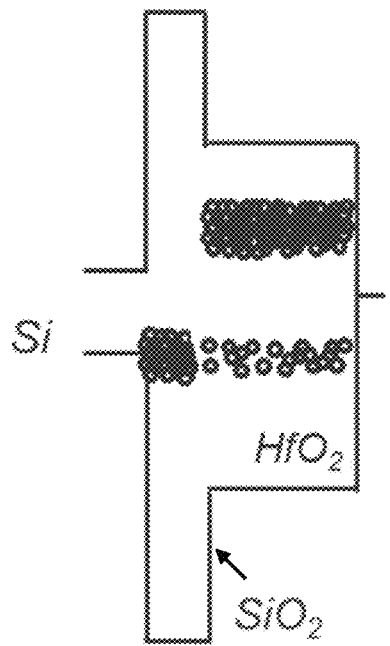
FIG. 4 shows the energy levels of an exemplary pMOS transistor gate stack.

Without being bound to any theory, whereas for nMOS transistors the PBTI may mainly be due to the electron traps in the high-k dielectric material, for pMOS transistors the NBTI may mainly be due to traps in the near-semiconductor interfacial $SiO_2$. For pMOS transistors hole traps in the high-k dielectric material still contribute to the NBTI however the NBTI is dominated by traps in the near-semiconductor interfacial $SiO_2$. The pMOS transistor energy bands are schematically illustrated in FIG. 4 which shows the hole traps in the $SiO_2$ of a gate stack comprising a Si substrate, a $SiO_2$ layer and a $HfO_2$ layer. When comparing the energy bands from FIG. 3 and FIG. 4 it can be seen that the dipole at the $SiO_2/HfO_2$ interface is mainly relevant to improve PBTI reliability by 'shifting-up' electron trap energy level in the high-k dielectric material and that this strategy is in principle less relevant for pMOS transistor NBTI. In pMOS transistors, the main issue comes from hole traps in the $SiO_2$ dielectric interlayer (IL), whereas minor impact of dipole on NBTI is expected. One of ordinary skill in the art would not have recognized that the solution implemented for nMOS transistors may not be effective for pMOS. Even when shifting the level in the high-k dielectric material, the traps in the native $SiO_2$ layer will still be present.

Figure 5:
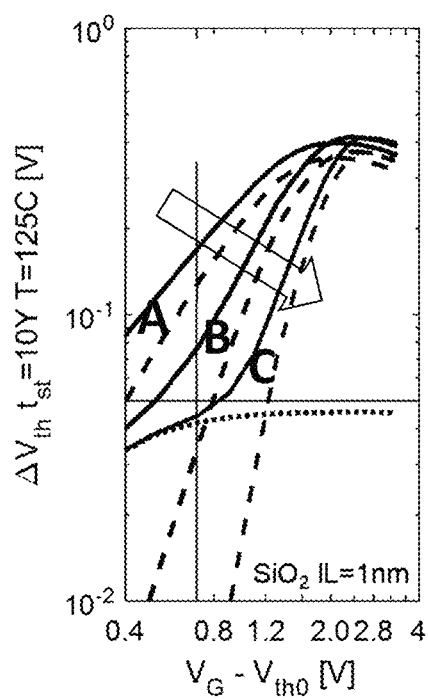
FIG. 5 is a graph wherein the curves show the result of dipole engineering of nMOS PBTI.
Figure 6:
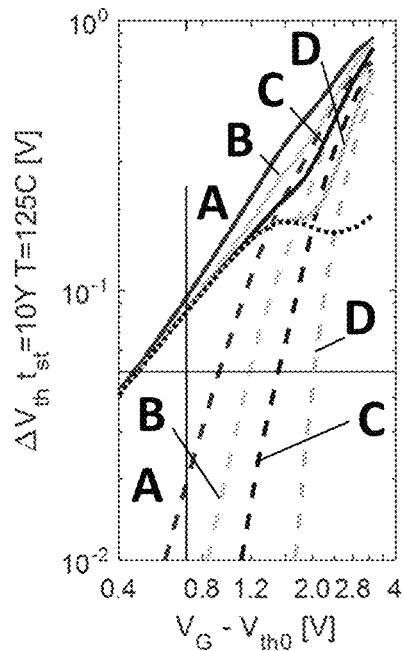
FIG. 6 is a graph wherein the curves show the result of dipole engineering of pMOS NBTI with a dielectric interlayer thickness of 1 nm.

This is confirmed by simulations which are illustrated by the graphs in FIG. 5 and FIG. 6. These figures show simulations of the impact of $SiO_2$ IL thickness on reliability improvement by dipole engineering for nMOS transistor PBTI and for pMOS transistor NBTI respectively. In both simulations the thickness of the $SiO_2$ IL is 1 nm, and the high-k dielectric layer ($HfO_2$) has a thickness of 2 nm. In both figures, the solid lines illustrate the reliability for a gate stack comprising traps in a dielectric interlayer ($SiO_2$) and a high-k dielectric layer ($HfO_2$). The dashed lines illustrate a gate stack comprising traps in the high-k dielectric layer ($HfO_2$) only. The dotted line illustrate a gate stack comprising traps in the dielectric interlayer ($SiO_2$) only.

In FIG. 5, the curves show the result of dipole engineering on nMOS transistors PBTI. The curves A (solid and dashed) are the reference curves of a low thermal budget stack (in this example the temperature remained below 500° C.). Curves B (solid and dashed) are simulated curves of a gate stack comprising a 0.2 eV dipole shift. Curves C (solid and dashed) are simulated curves of a gate stack comprising a 0.4 eV dipole shift. As can be seen from the solid curves in this figure the threshold voltage instability ($\Delta V_{th}$) can be reduced by introducing the dipole layer without applying a high thermal budget. The effect on the threshold voltage shift is present for the solid line (the stack comprising traps in the dielectric layer $SiO_2$) and for the dashed line (the stack without the traps in the $SiO_2$). Therefore, for nMOS transistor PBTI, the improvements appear insensitive to the IL thickness. As the electron traps are mainly located in the high-k dielectric material, there is a direct benefit of the interface dipole.

The curves in FIG. 6 illustrate the results of dipole engineering for pMOS transistors NBTI for a stack with a dielectric interlayer ($SiO_2$) thickness of 1 nm. In FIG. 6 the curves (A), including the solid and dashed lines, are the reference curves of a low thermal budget stack. Curves (B), including the solid and dashed lines, are the simulated curves of a gate stack including a 0.1 eV dipole shift, curves (C), including the solid and dashed lines, are the curves of a gate stack comprising a 0.2 eV dipole shift, and curves (D), including the solid and dashed lines, are the curves of a gate stack comprising a 0.4 eV dipole shift. It can be seen from FIG. 6 that improvement of reliability is minimal when introducing the dipole layer in a pMOS gate stack. It has been discovered that for an $SiO_2$ IL with a thickness of 1 nm or higher, hole trapping in $SiO_2$ is the main contributor to pMOS transistor NBTI. Hence, the improvement of introducing a dipole layer is minimal for a dielectric IL with a thickness of about 1 nm or higher.

It has been discovered that by scaling the $SiO_2$ IL to a few monolayers (<1 nm) the total number of traps in the $SiO_2$ can decrease to a point where they do not impact reliability. When decreasing the number of traps in the $SiO_2$ by decreasing the thickness of the IL, the traps in the high-k dielectric can become dominant. As discussed previously, the dipole layer can be used to mitigate the effects of the traps within the high-k dielectric. Thus, a significant improvement of the reliability can be obtained by introducing the dipole-forming capping layer when the dielectric IL has a thickness of less than 1 nm.

Figure 7:
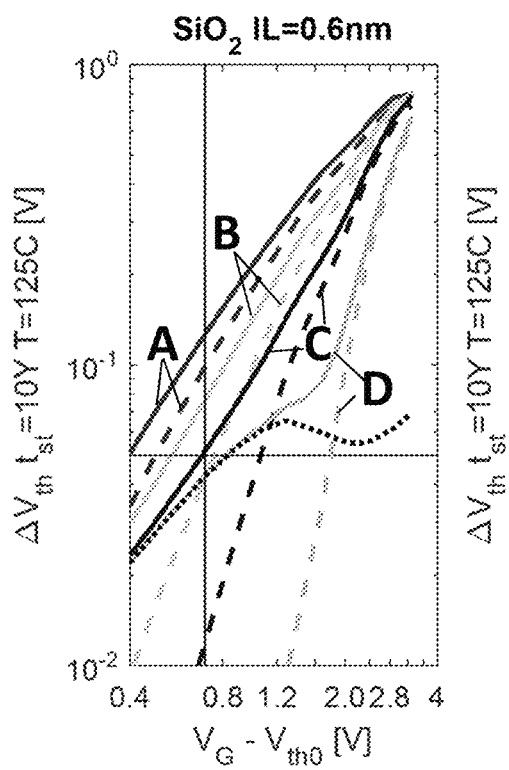
FIG. 7 is a graph wherein the curves show the result of pMOS transistor NBTI of an exemplary pMOS transistor gate stack in accordance with embodiments of the present disclosure.

This impact of the $SiO_2$ IL thickness on reliability improvement by dipole engineering is illustrated in the graph in FIG. 7 as compared to the graph in FIG. 6. Also in FIG. 7 the curves A, including the solid line and the dashed line, are the reference curves of a low thermal budget stack. Curves B, including the solid line and dashed line are the simulated curves of a gate stack comprising a 0.1 eV dipole shift, curves C, including the solid line and the dashed line, are the simulated curves of a gate stack comprising a 0.2 eV dipole shift, and curves D, including the solid line and the dashed line, are the simulated curves of a gate stack comprising a 0.4 eV dipole shift. The graph in FIG. 7 illustrates results from a pMOS transistor gate stack with an $SiO_2$ IL layer thickness of 0.6 nm. As can be seen from these graphs pMOS NBTI can be improved by dipole engineering if the $SiO_2$ IL is scaled sufficiently (i.e. below 1 nm), as opposed to when the $SiO_2$ IL has a thickness of 1 nm or above as is illustrated in FIG. 6.

Figure 8:
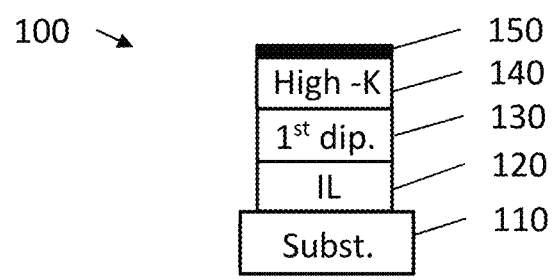
FIG. 8 shows a schematic diagram of an exemplary pMOS transistor gate stack in accordance with embodiments of the present disclosure.

FIG. 8 illustrates a first aspect embodiment of the present disclosure which includes a p-channel metal-oxide-semiconductor transistor comprising a gate stack 100. The gate stack includes a silicon oxide comprising dielectric interlayer 120 on a substrate 110. The dielectric interlayer 120 can have a thickness below 1 nm. The gate stack further includes a high-k dielectric layer 140 having a higher dielectric constant when compared to the dielectric interlayer 120. The gate stack further includes a first dipole-forming capping layer 130 between the dielectric interlayer 120 and the high-k dielectric layer 140 and in direct contact with the dielectric interlayer 120, for shifting down the bandgap of the high-k dielectric layer with respect to a valence band of the substrate 110, wherein the first dipole-forming capping layer 130 is in physical contact with the dielectric interlayer and has a thickness below 1 nm. The gate stack further includes at least one work function metal 150 above the high-k dielectric layer.

The dipole can be formed by depositing the dipole-forming capping layer (e.g. $Al_2O_3$) on and in direct contact with the dielectric interlayer (e.g. $SiO_2$). It has been discovered that a pMOS transistor gate stack comprising a high-k dielectric layer, on top of a dipole forming capping layer, on top of a dielectric interlayer increases the pMOS transistor NBTI reliability, compared to a stack without the dipole-forming capping layer, under certain conditions. For example, a thinner the dielectric interlayer (e.g. the $SiO_2$ IL) can allow the NBTI reliability to be effected primarily by traps in the high-k dielectric layer which has been discovered to occur when the thickness of the $SiO_2$ IL is below 1 nm.

In some embodiments, the substrate 110 may be a silicon substrate, the dielectric layer may be a $SiO_2$ layer, the first dipole-forming capping layer 130 may be an $Al_2O_3$ layer and the high-k dielectric layer may be an $HfO_2$ layer. In some embodiments, the substrate 110 may be a Germanium substrate, a Silicon Germanium substrate, or III-V compound substrate, provided that a $SiO_2$ IL is deposited on the substrate. The $SiO_2$ IL may for example be deposited with ALD. For all these embodiments, an $Al_2O_3$ layer can be in direct contact with $SiO_2$ IL which can be a dipole-forming capping layer.

Advantageously, the pMOS gate stack can be made without resorting to high-temperature reliability anneals (i.e., at low process thermal budgets, compatible with novel technologies) and nevertheless have a sufficient pMOS transistor NBTI reliability. Further, the pMOS transistor gate stack enables further $SiO_2$ and EOT scaling in standard Si technology, currently limited by reliability concerns, and that it therefore enables further CMOS performance enhancement. Thus, a further scaling of the $SiO_2$ IL (currently limited by reliability concerns) is enabled, thereby enabling a further performance improvement of CMOS technology.

In some embodiments, the thickness of the dielectric interlayer is below 1 nm. In some embodiments, the thickness of the dielectric interlayer is below 0.8 nm. In some embodiments, the thickness of the dielectric interlayer is about 0.6 nm. The dielectric interlayer may for example be a $SiO_2$ IL.

The dipole forming capping layer can have a thickness below 1.2 nm, below 1 nm, or below 0.5 nm. In some embodiments, the thickness is above 0.2 nm. In some embodiments, the thickness may be between 0.2 and 0.5 nm. When the dipole forming capping layer has a thickness of about 0.2 nm, a strong dipole effect can be obtained such that the reliability of the resulting pMOS transistor gate stack can be improved.

In some embodiments, an $Al_2O_3$ interlayer within a standard $SiO_2/HfO_2$ dielectric stack can be added. This can increase EOT. However, the reliability improvement can be significantly larger than the EOT increase, i.e., the maximum operating oxide electric field can improve dramatically. Therefore, the EOT increase can be mitigated by scaling the $SiO_2$ thickness. Given the higher dielectric constant of $Al_2O_3$ as compared to $SiO_2$, a ~0.2 nm $SiO_2$ thickness reduction can compensate for the EOT increase included with including the $Al_2O_3$ layer.

Figure 9:
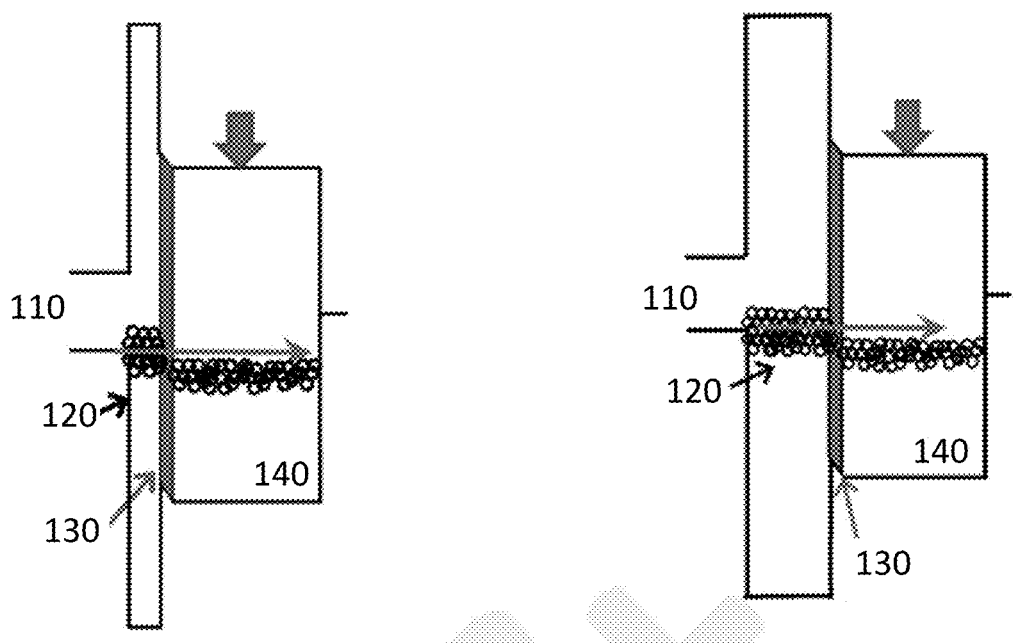
FIG. 9 shows the energy levels in an exemplary pMOS transistor gate stack in accordance with embodiments of the present disclosure compared with the energy levels of another exemplary pMOS transistor gate stack.

Still referring to FIG. 8, in some embodiments, the silicon comprising dielectric interlayer 120, the first dipole-forming capping layer 130, and the high-k dielectric layer 140 can be a portion of a gate dielectric stack. The at least one work function metal 150 can be a portion of a gate electrode stack. It will be appreciated that, in some RMG processes, a sacrificial gate electrode may first be formed over the high-k dielectric layer, which may subsequently be replaced by the at least one work function metal. For example, the sacrificial gate electrode may be a polysilicon layer. However, in some RMG processes, the sacrificial gate electrode may be completely removed. As such, in some embodiments, the gate stack 100 may be formed by an RMG process such that, in the final device, a silicon layer, e.g., a polysilicon layer, may not be included in at least the pMOS gate stack. For example, the pMOS gate stack may include the gate dielectric stack and the gate electrode stack disposed on a substrate 110. In some embodiments, the gate electrode stack may only consist of the work function metals 150 and may not include polysilicon. It will be appreciated that a gate electrode that does not include polysilicon can be advantageous for various reasons, including threshold voltage tuning using work-function tuning, threshold voltage reduction and/or enabling the omission of high-temperature dopant activation in polysilicon, to name a few. For example, when the pMOS is formed as part of a back-end-of-line of a semiconductor device (see, e.g., FIG. 24 and the associated text), a gate stack that does not include polysilicon can advantageously be formed without activating the dopant in polysilicon. FIG. 9 shows energy levels in a pMOS gate stack (the illustration on the left) in accordance with embodiments of the present disclosure and in a comparative example pMOS transistor gate stack (the illustration on the right).

In both cases the pMOS transistor gate stack comprises a silicon oxide comprising a dielectric interlayer 120 on a substrate 110, a first dipole-forming (p-dipole) capping layer 130 having a thickness below 1 nm, for shifting an energy level of high-k traps within a high-k dielectric layer 140 on top of the first dipole-forming capping layer 130. the device in the illustration on the left, the thickness of the dielectric interlayer has a thickness below 1 nm whereas the device in the illustration on the right, the thickness of the dielectric interlayer has a thickness above 1 nm.

By introducing the first dipole-forming layer 130 between the dielectric interlayer 120 and the high-k dielectric layer 140 and by scaling the dielectric interlayer 120 to a thickness below 1 nm it is possible to match the NBTI reliability of a standard high thermal budget process with minimal EOT increase. The reliability is maintained when scaling the dielectric interlayer 120 to compensate for the EOT increase. This is illustrated in FIG. 10.

As previously discussed, scaling of the dielectric interlayer 120 decreases makes the high-k traps within the high-k dielectric layer dominant over the traps within the dielectric interlayer to improve pMOS transistor NBTI.

Figure 10:
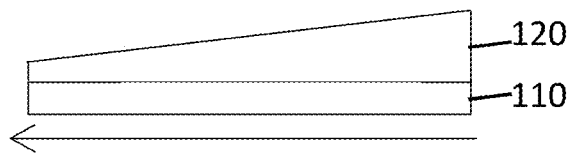
FIG. 10 is a graph illustrating the effect of the first dipole forming layer on the reliability of an exemplary pMOS gate stack for different thicknesses of the dielectric interlayer.
Figure 10:
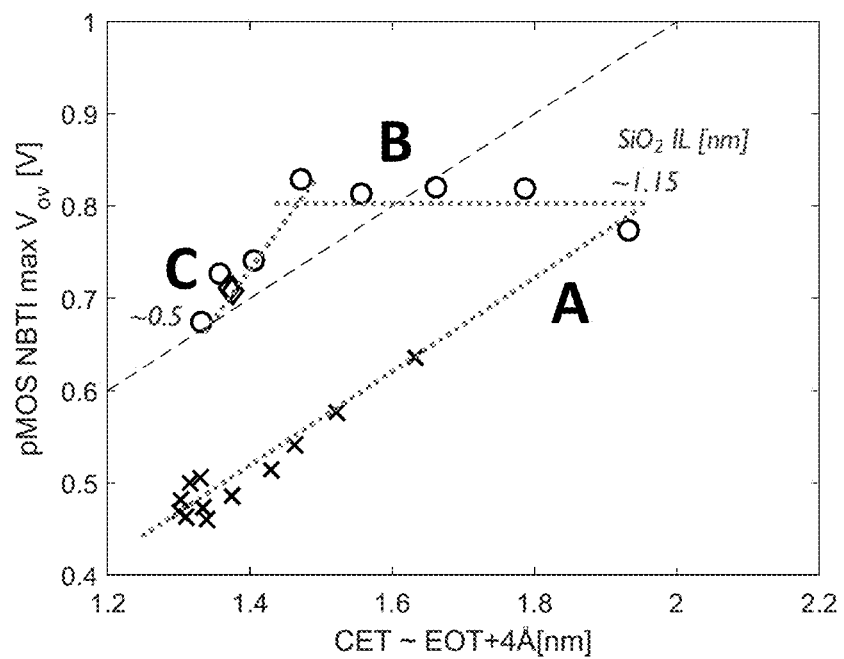

As is illustrated in the graph in FIG. 10 shifting down the high-k bandgap is less effective when the $SiO_2$ IL has a thickness of 1 nm or greater. The graph shows experimental data of a pMOS transistor gate stack in accordance with embodiments of the present disclosure and of an exemplary pMOS transistor gate stack with a $SiO_2$ IL with a thickness above 1 nm. The thickness of the silicon oxide comprising dielectric interlayer 120 disposed on top of the substrate 110 is linearly varying from about 0.5 nm up to about 1.2 nm, as is shown in the schematic stack drawing above the graph.

Instead of plotting the threshold voltage instability as illustrated in FIG. 7, the maximum operating overdrive voltage that can be applied on a given gate stack for the device operating lifetime without inducing a threshold voltage instability larger than a predetermined value (i.e., a failure criterion) is plotted in the vertical axis. This voltage is preferably as large as possible because a higher voltage corresponds with an increased stability of the gate stack. A failure criterion of, for example, 4 mV during 1000 seconds at 25° C. approximately corresponds with a failure criterion of ~30 and ~50 mV during 10 years at a temperature of 25° C. and 125° C., respectively. In this graph the "x" symbols indicate results which are obtained with a stack as deposited (without dipole forming layer), the "◊" symbols correspond with results of the same stack after a reliability anneal, and the "○" symbols correspond with a stack including a first dipole-forming $Al_2O_3$ capping layer with a thickness of 0.2 nm in accordance with embodiments of the present disclosure. The dashed line shows a trendline corresponding to an applied electric field (Eox) of 5 MV/cm on the dielectric interlayer.

The maximum operating voltage on the horizontal axis is shown in function of the capacitance equivalent thickness (CET) on the vertical axis of the gate stack.

The stack comprises a first dipole forming capping layer of $Al_2O_3$ with a thickness of 0.2 nm. It is demonstrated that a thickness of 0.2 nm of the $Al_2O_3$ dipole forming layer can yield sufficient NBTI reliability. The dipole forming layer thickness is, however, not limited to this thickness. The thickness may for example range between 0.2 and 1 nm.

The top schematic drawing of FIG. 10 shows a slant-etched $SiO_2$ IL disposed on top of a silicon substrate with a decreasing thickness from right to left. Curve (A) shows the reference voltage of a gate stack for which no anneal step has been applied. As can be seen from this curve the gate stack can only withstand low operating voltages. Curve (B) shows the improvement after applying a high temperature anneal step. The device operates at this dashed line (corresponding to an electric field of 5 MV/cm on the dielectric interlayer) or preferably even above this dashed line. To bridge this gap the standard solution is to apply the temperature anneal with a temperature above 800° C. Curve (C) shows the voltage of a pMOS gate stack in accordance with embodiments of the present invention. $Al_2O_3$ is introduced and forms a positive dipole which shifts 'down' the high-k bandgap (and therefore the defect levels therein) w.r.t. Si valence band. As can be seen from FIG. 10, if the $Al_2O_3$ is introduced with a thick $SiO_2$ (thickness ≥1 nm), it does not improve the NBTI reliability. If the thickness of the $SiO_2$ is decreased below 1 nm, the introduction of the $Al_2O_3$ has a positive effect on the maximum operating voltage. At about 0.6 nm thickness of the $SiO_2$ IL, the reliability of the gate stack according to embodiments of the present invention matches with the high thermal budget gate stack. From these experiments it can be concluded that the introduction of the first dipole-forming capping layer is effectively improving the reliability provided that the dielectric interlayer is scaled to a thickness below 1 nm.

This scaling down of the thickness of the dielectric interlayer (e.g. $SiO_2$) below 1 nm is counterintuitive for the person skilled in the art. When trying to solve the pMOS NBTI reliability issue, the person skilled in the art would instead increase the thickness of the dielectric interlayer in order to increase the capacitance equivalent thickness and hence to reduce the electric field on the oxide at a given gate voltage, thereby improving the reliability. This is the reason why in current technology the IL scaling has stopped at ~1 nm, after decades of continuous scaling from one technology generation to the next. Another reason why the skilled reason would not reduce the thickness of the dielectric interlayer is to avoid gate leakage increase due to a thinner interlayer.

Other approaches the person skilled in the art would take when trying to solve the pMOS NBTI reliability issue are:

Performing a post deposition anneal >800° C., as customary in Replacement Gate (RMG) High-K-last integration schemes. Note this anneal would be a 'built in' step in alternative integration schemes as Gate-First Metal-Inserted Poly-Silicon (MIPS) or RMG High-k-First (HKF) integration schemes. This is, however, incompatible with novel low thermal budget integration concepts.

Depositing a cap on top of the high-k layer, followed by a drive-in anneal to passivate/modify the defects in the high-k layer. Such a step would be good for nMOS PBTI but it would, however, not be effective for pMOS NBTI (as most of the relevant defects are in the $SiO_2$ interlayer close to the channel). Moreover, the drive-in step is incompatible with novel low thermal budget integration concepts.

Figure 25:
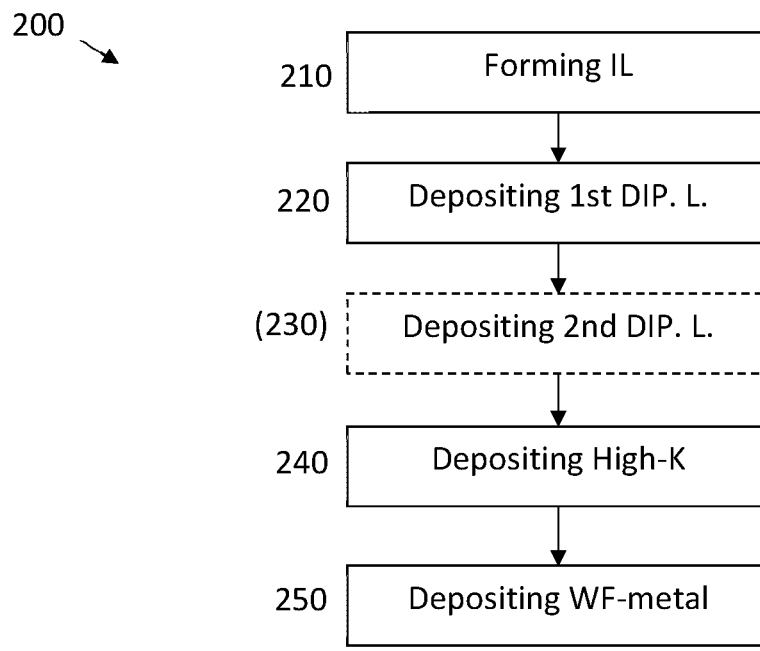
FIG. 25 shows a flow chart of a method in accordance with embodiments of the present disclosure.

In a second aspect embodiments of the present disclosure relate to a method 200 for forming a p-channel metal-oxide-semiconductor gate stack. An exemplary flow chart of such a method is illustrated in FIG. 25. The method comprises:

forming 210 a silicon oxide comprising dielectric interlayer 120 with a thickness below 1 nm on a substrate 110, depositing 220 a first dipole-forming capping layer 130 with a thickness below 1 nm on and in physical contact with the dielectric interlayer, depositing 240 a high-k dielectric layer 140 above the first dipole-forming capping layer 130 having a high-K bandgap, wherein the first dipole-forming capping layer 130 is adapted for shifting down the high-K bandgap with relation to a valence band of the substrate 110, depositing one or more work function metals 150 above the high-k dielectric layer.

In a method according to embodiments of the present disclosure the high temperature post deposition reliability anneal is removed to make the fabrication compatible with low thermal budget applications. This is possible because the reliability is improved by the first dipole-forming capping layer between the dielectric interlayer, with thickness below 1 nm, and the high-k dielectric layer.

Deposition of the dipole-forming capping layer and of the high-k dielectric layer may be done by techniques such as, for example, physical vapor deposition or atomic layer deposition.

The step 230 for depositing the second dipole layer shown in FIG. 25 is only an optional step and will be discussed later.

Moreover the size of the dielectric interlayer is scaled to a thickness below 1 nm, or even below 0.9 nm, or even below 0.7 nm, for example 0.6 nm or below 0.6 nm. By simulations using proprietary software the inventors have found out that pMOS NBTI reliability becomes dominated by high-k defect levels (which can be shifted), similarly to nMOS PBTI, when the thickness of the dielectric interlayer is scaled to a thickness below 1 nm.

In a method in accordance with embodiments of the present invention a first dipole-forming capping layer (e.g. $Al_2O_3$) which has a thickness below 1 nm is on top of the dielectric layer (e.g. $SiO_2$) and a high-k dielectric layer is provided on top of the dipole-forming capping layer. The dipole-forming capping layer is introduced for shifting an energy level of high-k traps of the high-k dielectric layer w.r.t. the semiconductor channel band edges. In embodiments of the present invention the dipole formation results in a shift of the high-k defect levels w.r.t. Si valence band.

Without the high temperature anneal, the defect density in the IL and high-k increases, but the defect levels are shifted in energy by the dipole-forming layer so they are not accessible at the operating voltage.

As discussed above, reducing the thickness of the dielectric interlayer would normally result in a degraded reliability and therefore it would not be obvious to the skilled person to reduce this thickness. But it is an advantage of a pMOS gate stack according to embodiments of the present invention that it can withstand higher oxide fields as the defect levels shifted in energy remain inaccessible.

Also, inserting a relatively low-k layer (the dipole-forming capping layer, having lower dielectric constant compared to the $HfO_2$ high-k layer) would be counterintuitive for a person skilled in the art, because it results in an effective oxide thickness (EOT) penalty and hence in a performance penalty. However, it is an advantage of embodiments of the present invention that this penalty can be compensated by the scaling of the dielectric interlayer to a thickness below 1 nm.

Also, inserting an additional potentially defective layer (a dipole-forming capping may be a non native oxide deposited with a low temperature ALD process), would be counterintuitive for a person skilled in the art. However, the inventors have found out that the defect levels of the dipole-forming capping layer do not interact with Si valence band which is good for pMOS reliability.

Figure 11:
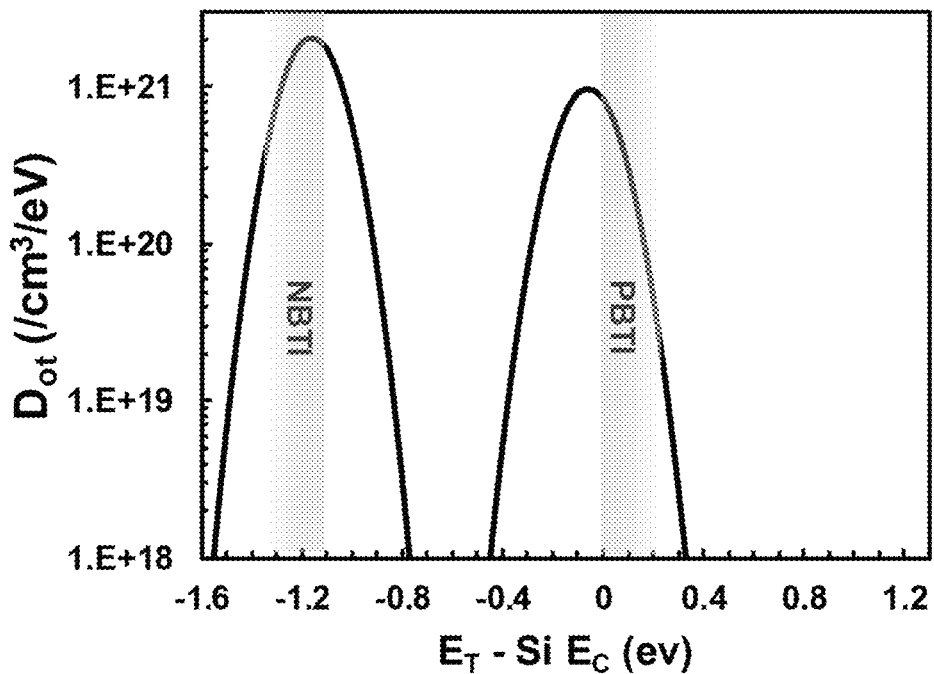
FIG. 11 and FIG. 12 illustrate the effects of hole traps in a $Al_2O_3$ cap on pMOS NBTI compared to the effects of hole traps in a $HfO_2$ cap.
Figure 12:
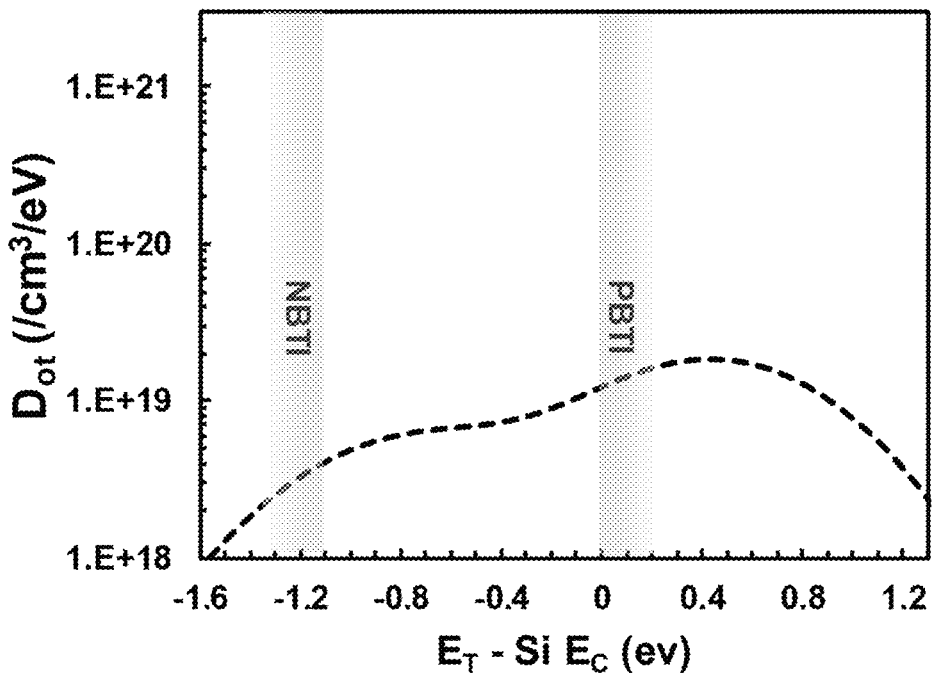

By calibrating simulations to experimental data of charge trapping in low thermal budget $HfO_2$ and $Al_2O_3$ layers, the inventors have derived the energy distribution of defect levels in these layers, as shown in FIG. 11 (for $HfO_2$ as deposited) and FIG. 12 (for $Al_2O_3$ as deposited), concluding that $Al_2O_3$ has a negligible density of defect levels around the Si valence band, and is therefore suitable for use in a pMOS device gate stack without contributing a significant additional number of traps compared to $HfO_2$. For pMOS NBTI, the most relevant energy levels are the ones close to Et−Ec=1.12 eV=Ev. Low thermal budget $HfO_2$ shows at that energy a density of defects of $\sim 2e21/cm^3/eV$, while at the same energy level the low thermal budget $Al_2O_3$ shows a defect density of 'only' $\sim 4e18/cm^3/eV$.

When trying to improve the pMOS NBTI reliability the inventors did a number of simulations using in-house developed BTI simulation software. To the surprise of the inventors themselves these simulations suggested that for a thin $SiO_2$ IL (<0.8 nm), the traps in the high-k dielectric layer contribute to a large fraction of the total pMOS NBTI degradation, particularly due to the high defect density pertaining to low temperature process flows. The calculations suggested that a dipole shift of $\sim 0.4$ eV at the interface between $SiO_2$ and $HfO_2$ would suppress charge trapping enough to demonstrate more than sufficient pMOS NBTI reliability.

Therefore, the inventors searched for a dipole capping layer for shifting an energy level of high-k traps of the high-k dielectric layer. A suitable layer therefore was a thin $Al_2O_3$ oxide layer deposited on the dielectric interlayer (e.g. $SiO_2$). Such a layer can yield a dipole shift up to 0.35 eV. Based on data analysis the inventors concluded that additional oxide traps in the dipole-forming $Al_2O_3$ layer, would not contribute to pMOS NBTI due to their energy level being away from Si valence band.

When adding an $Al_2O_3$ interlayer within a standard $SiO_2$/$HfO_2$ dielectric stack, an EOT penalty is inherent. However, the reliability improvement is significantly larger than the corresponding EOT increase, i.e., the maximum operating oxide electric field improves dramatically. Therefore, the intrinsic EOT penalty could be recovered by scaling the $SiO_2$ thickness. Given the higher dielectric constant of $Al_2O_3$ as compared to $SiO_2$, a $\sim 0.2$ nm $SiO_2$ thickness reduction would already compensate more than adequately the EOT penalty induced by the necessary $Al_2O_3$ layer.

According to an exemplary embodiment of the present invention the inventors designed a pMOS gate stack comprising a thin $SiO_2$ IL with a thickness below 1 nm (e.g. 0.6 nm), a thin $Al_2O_3$ dipole-forming layer (0.2-1 nm), and a standard $HfO_2$ high-k dielectric layer (1-1.9 nm), which according to calculations could yield sufficient reliability.

In an experiment MOS capacitors were fabricated by depositing the designed stack. NBTI measurements confirmed a substantially improved reliability. This gate stack design can yield reliability on par with high-thermal budget processes, without requiring any "reliability anneal" or high temperature (e.g. >500° C.) steps after the dielectric deposition.

Figure 13:
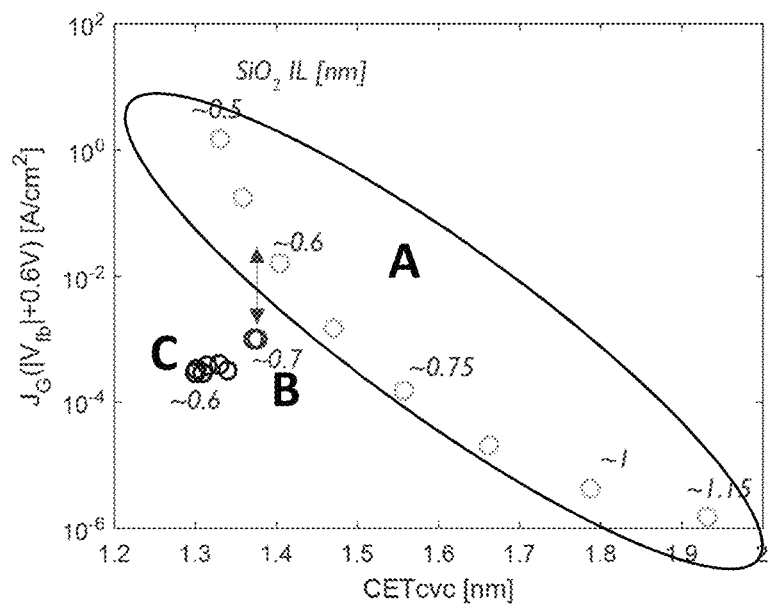
FIG. 13 shows the gate leakage current density for an increasing thickness of the dielectric interlayer of a pMOS transistor gate stack in accordance with embodiments of the present disclosure in comparison with the gate leakage current density current density of an exemplary pMOS transistor gate stack after reliability anneal.

FIG. 13 shows that for an increasing thickness of the $SiO_2$ IL 120 the gate leakage current density is decreasing (see points A). For a 0.6 nm thick $SiO_2$ layer in the pMOS stack according to embodiments of the present invention the same reliability is obtained as for a prior art pMOS stack with a $SiO_2$ layer thickness of 0.7 nm after a reliability anneal (see point B). It can be seen in this graph that the additional current leakage due to the thinner $SiO_2$ is only minor, and the total leakage remains below an acceptable level of 1 A/cm². Points C are the results of a prior art pMOS stack as deposited.

Figure 14:
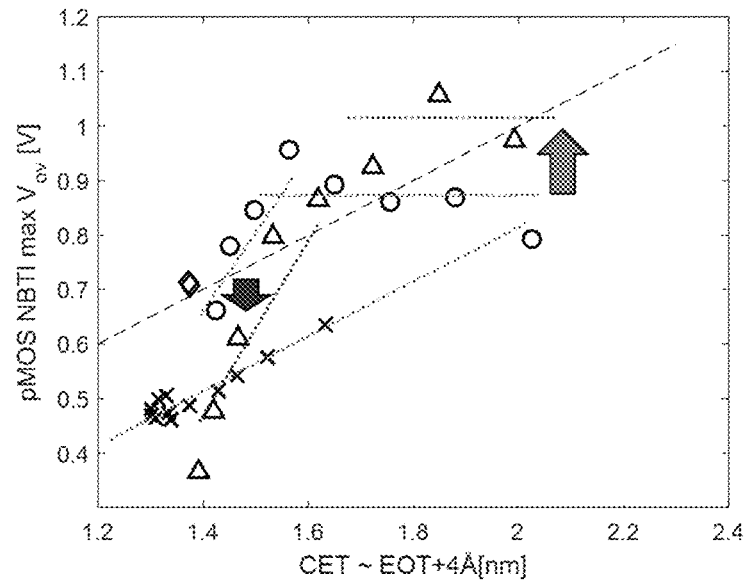
FIG. 14 shows a graph illustrating the reliability of a pMOS transistor gate stack in accordance with embodiments of the present disclosure after reliability anneal.

In FIG. 14 is evaluated whether $Al_2O_3$ be combined with reliability anneal for further improvement of bottom tier reliability. The failure criterion is shown in function of the capacitance equivalent thickness. A failure criterion of for example 4 mV during 1000 seconds at 25° C. thereby approximately corresponds with a failure criterion of ~30 or ~50 mV during 10 years at a temperature of 25° C. or 125° C., respectively. In this graph the "x" symbols indicate results which are obtained with a stack as deposited (without dipole forming layer), the "◇" symbols correspond with results of the same stack after a reliability anneal, the "○" symbols correspond with a stack comprising a first dipole-forming $Al_2O_3$ capping layer with a thickness of 0.5 nm in accordance with embodiments of the present invention, and the "Δ" symbols correspond with a stack comprising a first dipole-forming $Al_2O_3$ capping layer with a thickness of 0.5 nm after a reliability anneal. The dashed line shows an $E_{ox}$ of 5 MV/cm. This graph shows that for a thin $SiO_2$ there is a loss of reliability when exposing the stack to high temperature (850° C. for 1.5 s, i.e. a typical 'reliability anneal' condition). As can be seen from this graph the reliability improvement which is made by introducing the $Al_2O_3$ is lost by heating of the stack. This is especially the case for dipole-forming capping layers with a thickness below 1 nm.

For a dielectric interlayer with a thickness above 1 nm the NBTI is dominated by $SiO_2$ hole traps, whose density is reduced by the rel. anneal and therefore results in an improved reliability.

Figure 15:
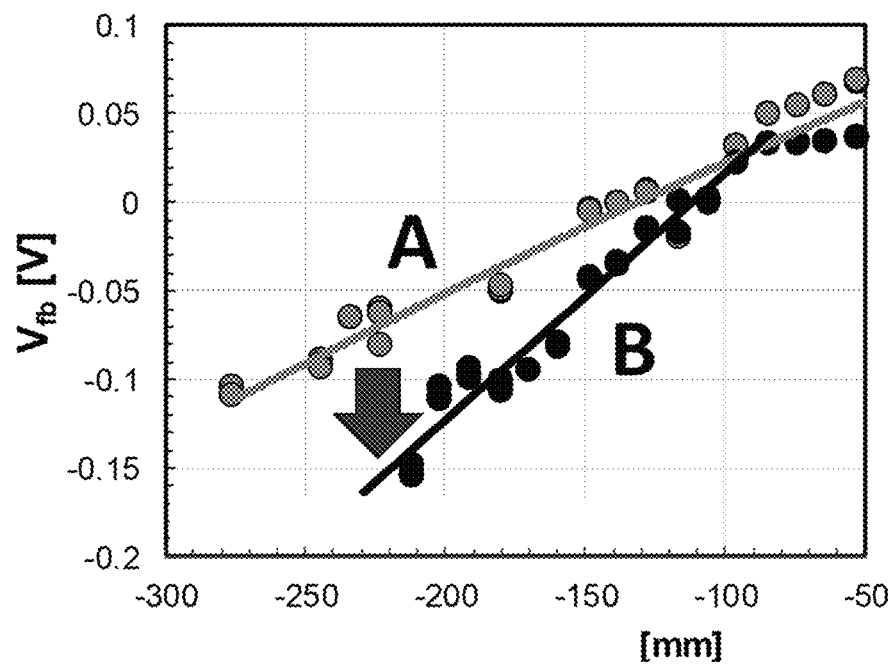
FIG. 15 shows the flat band voltage of a pMOS transistor gate stack in accordance with embodiments of the present disclosure before and after reliability anneal.

The dipole shift is typically measured by looking at the flatband voltage of a MOS capacitor without vs. with the dipole forming layer. The graph in FIG. 15 shows the flat band of the gate stack before (A) and after (B) performing a reliability anneal at 850° C. (1.5 s duration) in function of the thickness of the $SiO_2$ interlayer. In fact, the horizontal axis represents a Y location on the wafer (in mm) which is linearly related to the $SiO_2$ interlayer thickness. As can be seen from this graph there is dipole loss as a result of the layer intermixing induced by the heating. Therefore, the reliability improvement induced by the dipole-forming layer is not maintained after applying a high thermal budget.

Figure 16:
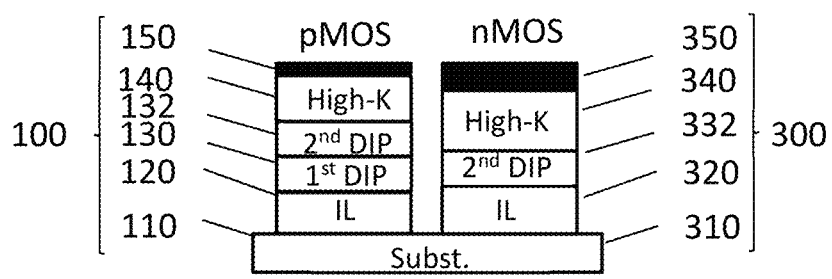
FIG. 16 shows a schematic diagram of a CMOS device including both a pMOS transistor gate stack and a nMOS transistor gate stack in accordance with embodiments of the present disclosure.

In embodiments of the present disclosure the method 200 may comprise providing the nMOS gate stack and the pMOS gate stack by using steps for forming the pMOS stack also for forming the nMOS stack. An example of these stacks is given in FIG. 16.

The combined method comprises the following steps:
  forming 210 a dielectric interlayer 320 with a thickness below 1 nm on the semiconductor substrate for the nMOS gate stack 300, while also forming 210 the dielectric interlayer 120 for the pMOS gate stack 100,
  depositing 230 a second dipole-forming capping layer 332, 132 above the dielectric interlayer 320 for the nMOS gate stack 300 and above the first dipole-forming capping layer 130 for the pMOS gate stack 100, for simplified CMOS dual gate stack integration,
  depositing 240 a high-k dielectric layer 340 above the second dipole-forming capping layer 332 of the nMOS gate stack 300, while depositing 240 the high-k dielectric layer 140 of the pMOS gate stack 100, wherein the second dipole-forming capping layer (332) is adapted for shifting up the high-K bandgap with relation to the valence band of the semiconductor substrate, depositing 250 one or more work function metals 150, 350.

The stacks of two dipole layers on the pMOS allows to simplify the dual gate stack integration. This disclosure is, however, not limited thereto. In fact, a pMOS gate stack according to embodiments of the present disclosure would work (even better) if the pMOS would have only its own (the first) dipole-forming layer.

In an exemplary embodiment of the present disclosure, the second dipole-forming capping layer 332 of the nMOS transistor is $La_xSi_yO_z$ (with x and z necessarily >0, while y may be equal to 0, e.g. $La_2O_3$), and the interfacial dielectric layer 320 of the nMOS transistor is $SiO_2$ and the high-k dielectric layer 340 of the nMOS transistor is $HfO_2$ and the dielectric interlayer 120 of the pMOS transistor is $SiO_2$, and the high-k dielectric layer 140 of the pMOS transistor is $HfO_2$, and the first dipole-forming capping layer 130 of the pMOS transistor is $Al_2O_3$. In this example no second dipole-forming layer is present in the pMOS stack. In this exemplary embodiment of the present invention the dielectric interlayer 120 of the pMOS transistor has a thickness below 1 nm and above 0.2 nm and the first dipole-forming capping layer 130 of the pMOS transistor has a thickness below 2 nm and above 0.1. The thickness of the high-k dielectric layer 340 of the nMOS transistor may for example range between 1 nm and 3 nm or even between 1 nm and 2.5 nm. The second dipole-forming capping layer 332 of the nMOS transistor is $La_xSi_yO_z$. The thickness thereof may for example range between 0.1 nm and 2 nm, or even between 0.1 and 1 nm. The interfacial dielectric layer of the nMOS transistor may for example be $SiO_2$. Its thickness may for example range between 0.2 and 1 nm (or even up to 2 nm is possible for nMOS). The high-k dielectric layer of the nMOS transistor may for example be $HfO_2$. Its thickness may for example range between 1 nm and 3 nm.

Figure 17:
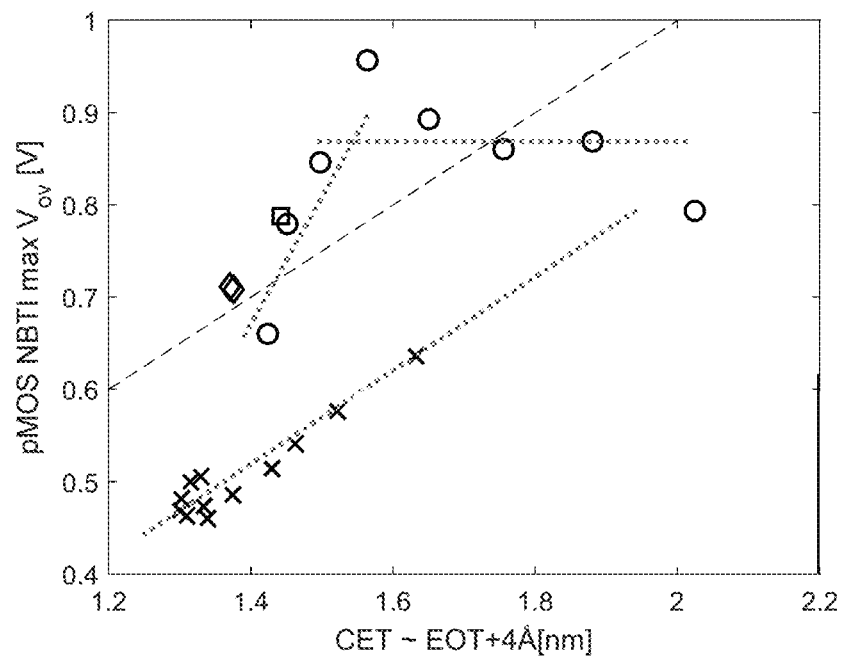
FIG. 17 is a graph illustrating the reliability of a pMOS transistor gate stack in accordance with embodiments of the present disclosure after introducing a second dipole forming capping layer.
Figure 18:
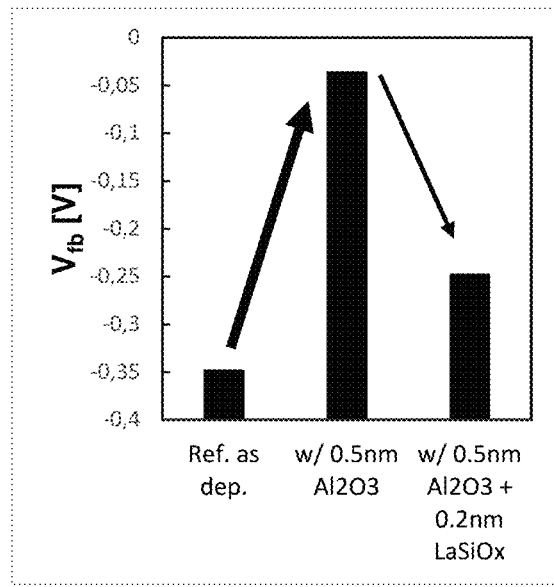
FIG. 18 is a graph illustrating the effect on its flat band voltage of inserting a second dipole forming capping layer in a pMOS gate stack in accordance with embodiments of the present disclosure.

In embodiments of the present disclosure, the process for depositing the dual gate stack may be simplified by depositing the second dipole forming capping layer on top of the first dipole forming capping layer. This is illustrated in FIG. 17 and FIG. 18 wherein is evaluated whether $LaSiO_x$ can be deposited on top of $Al_2O_3$ without pMOS reliability penalty. From these graphs it can be seen that with a 0.5 nm thick $Al_2O_3$ layer the residual net dipole shift is still sufficient to meet the NBTI reliability target, despite the $LaSiO_x$ on top (residual from the nMOS gate stack fabrication). FIG. 17 shows the failure criterion in function of the capacitance equivalent thickness. A failure criterion of for example 4 mV during 1000 seconds at 25° C. thereby approximately corresponds with a failure criterion of ~30 or ~50 mV during 10 years at a temperature of 25° C. and 125° C., respectively. In this graph the "x" symbols indicate results which are obtained with a stack as deposited (without dipole forming layer), the "◊" symbols correspond with results of the same stack after a reliability anneal, the "○" symbols correspond with a stack comprising a first dipole-forming $Al_2O_3$ capping layer with a thickness of 0.5 nm in accordance with embodiments of the present invention, and the "□" symbol correspond with a stack comprising a first dipole-forming $Al_2O_3$ capping layer with a thickness of 0.5 nm with on top thereof a 0.2 nm $LaSiO_x$ layer. The dashed line shows an Eox of 5 MV/cm.

Figure 19:
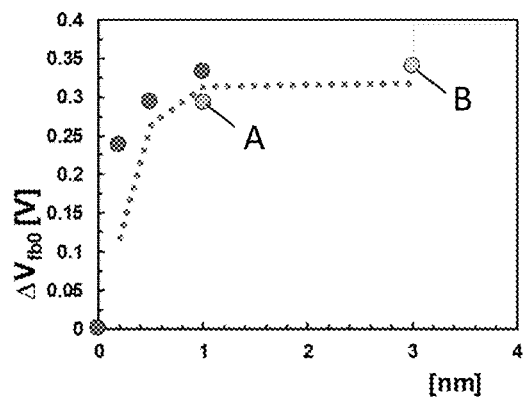
FIG. 19 shows the dipole shift in function of the nominal $Al_2O_3$ thickness of a pMOS transistor gate stack in accordance with embodiments of the present disclosure.

FIG. 19 shows the dipole shift in function of the nominal $Al_2O_3$ thickness (in nm) of a pMOS gate stack in accordance with embodiments of the present disclosure. Reference points with thin $HfO_2$ (A) and no $HfO_2$ (B) are shown.

Figure 20:
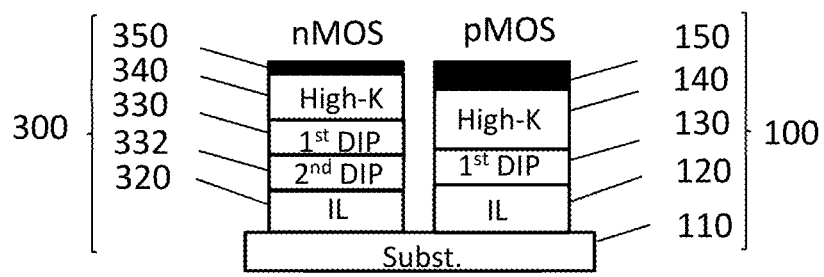
FIG. 20 shows a schematic drawing of CMOS device including both a pMOS transistor gate stack and a nMOS transistor gate stack in accordance with embodiments of the present disclosure, however, illustrating decreased reliability of the nMOS transistor gate stack compared to a nMOS transistor gate stack with the second dipole forming capping layer.

It is also evaluated whether depositing the first dipole forming capping layer on the second dipole forming capping layer would be an option for the nMOS gate stack without nMOS reliability penalty. An example of a gate stack which would be obtained using such a method is illustrated in FIG. 20.

Figure 21:
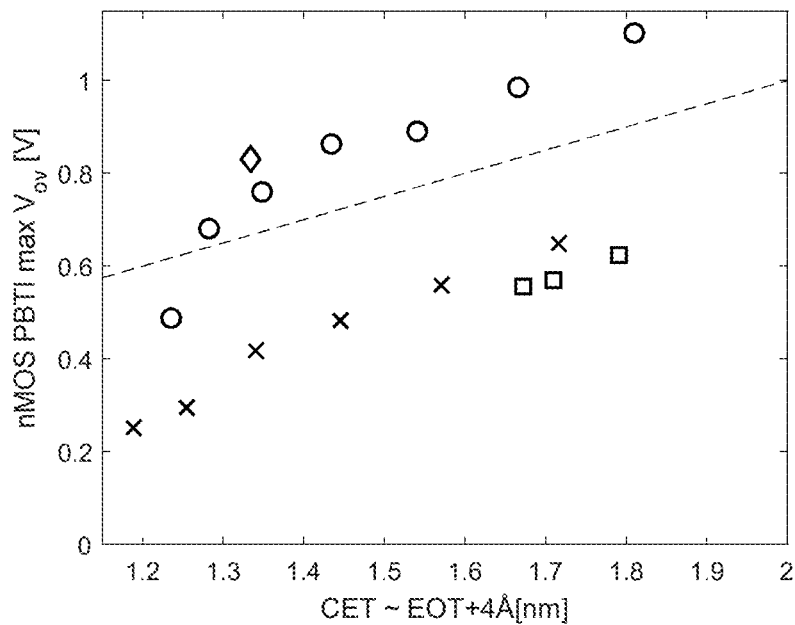
FIG. 21 is a graph illustrating the reliability of a nMOS transistor gate stack after introducing a first dipole form capping layer on top of a second dipole forming capping layer.

This is evaluated for $Al_2O_3$ as first dipole forming capping layer and $LaSiO_x$ as second dipole forming capping layer. FIG. 21 shows the failure criterion in function of the capacitance equivalent thickness. A failure criterion of for example 4 mV during 1000 seconds at 25° C. thereby approximately corresponds with a failure criterion of ~30 or ~50 mV during 10 years at a temperature of 25° C. and 125° C., respectively. In this graph the "x" symbols indicate results which are obtained with a stack as deposited (without dipole forming layer), the "◊" symbols correspond with results of the same stack after a reliability anneal, the "○" symbols correspond with a stack comprising a second dipole-forming $LaSiO_x$ capping layer with a thickness of 0.2 nm, and the "□" symbol correspond with a stack comprising a second dipole-forming $LaSiO_x$ capping layer with a thickness of 0.2 nm with on top thereof a 0.5 nm $Al_2O_3$ layer. The dashed line shows an Eox of 5 MV/cm.

Figure 22:
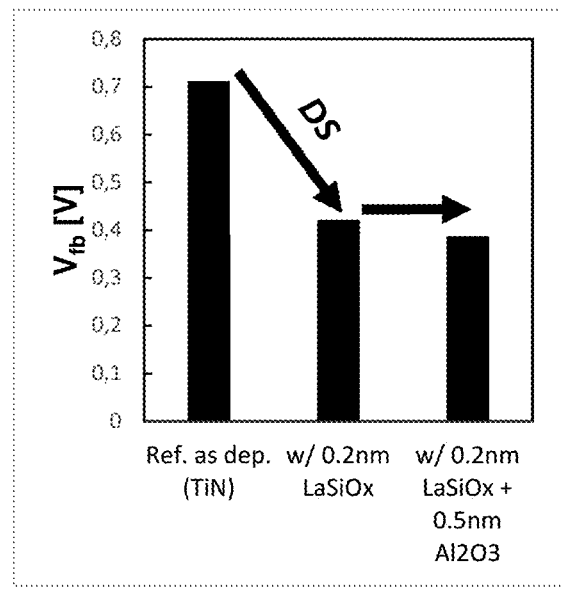
FIG. 22 is a graph illustrating the effect of inserting a first dipole forming capping layer on top of a second dipole forming capping layer in a nMOS transistor gate stack on its flat band voltage.
Figure 23:
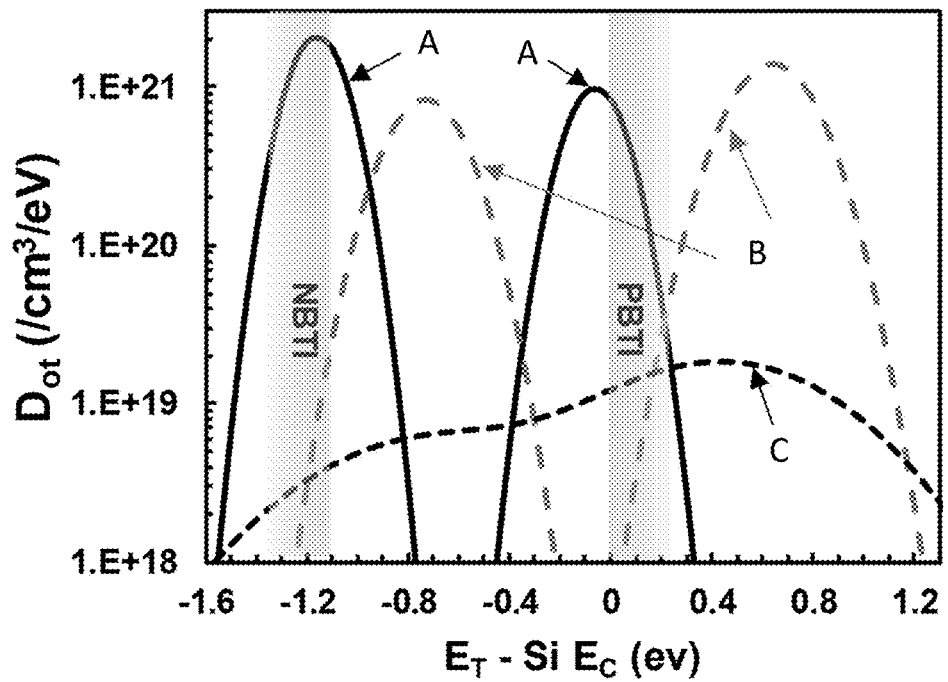
FIG. 23 shows the $D_{ot}$ of $HfO_2$ at low temperature and at high temperature and of $Al_2O_3$ at low temperature.

As can be seen from FIG. 21 and FIG. 22 with $Al_2O_3$ in the nMOS gate stack, the nMOS PBTI reliability is subpar w.r.t. the reference stack as deposited. There is a PBTI reliability loss despite remaining net dipole shift (DS in FIG. 22). This may be caused by $Al_2O_3$ which introduces a non-negligible density (i.e., >1e19/cm³/eV) of electron traps aligned to Si conduction band, and which is detrimental for nMOS gate stack. FIG. 23 shows the distribution of defects in $HfO_2$ as deposited (A), and after a reliability anneal (B) (i.e., state-of-the-art gate stack). As can be seen from the figure the reliability anneal slightly reduces the defect density, and most importantly shifts the distribution in a way that the density of defects around Si conduction (and valence) band is dramatically reduced. The dipole layers implement, in a completely different way, the same effects: they shift the distribution of defects in energy in order to minimize the defects around the Si conduction (and valence) band. The figure also shows the distribution C of 'native' defects in $Al_2O_3$. The valence band of Si for this density is smaller than the residual density of $HfO_2$ defects after the shift. Therefore, the introduction of $Al_2O_3$ doesn't add a detrimental density of defects of relevance for pMOS. On the contrary, at the conduction band $Al_2O_3$ would add a density of defects much larger than the residual density of $HfO_2$ defects after the shift. Therefore, the insertion of $Al_2O_3$ is detrimental for the nMOS.

Figure 24:
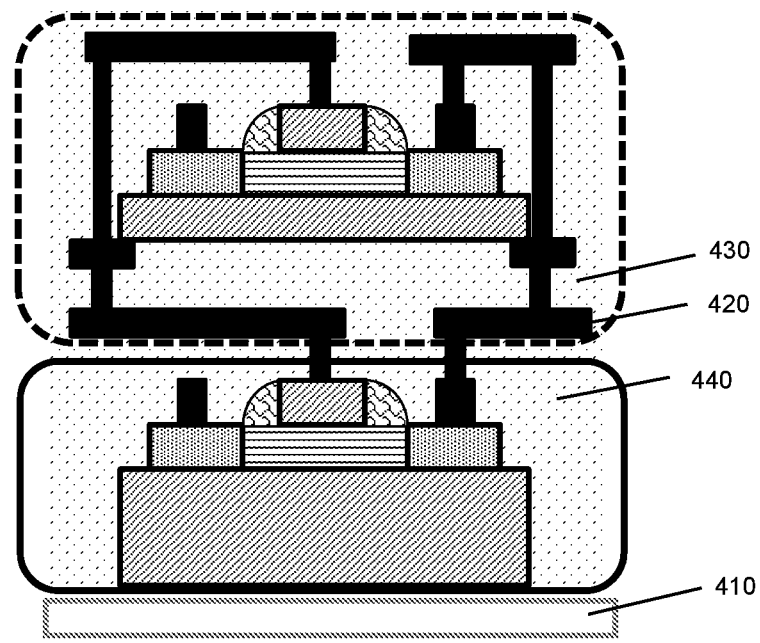
FIG. 24 shows a schematic drawing of a three-dimensional stack of transistors which comprises a pMOS transistor in accordance with embodiments of the present invention.

It is an advantage of embodiments of the present disclosure that reliability can be achieved without a high temperature anneal, more specifically reliability anneal. A pMOS gate stack in accordance with embodiments of the present invention can for example be applied in a sequential 3D stack of CMOS logic tiers (an exemplary 3D stack of Seq3D over CMOS is illustrated in FIG. 24), in a CMOS over memory array 410, or in CMOS incorporated in the BEOL (e.g. access transistor/selector memory cell). The rectangle with the solid indicates the parts of the stacked device where one would be allowed to use high temperature (e.g., >800° C.) steps and the dashed lines highlight the parts of the stacked device where one needs to use low thermal budget solutions. Thus, according to embodiments, a pMOS transistor according to embodiments described herein is formed over a metallization level including a metal line, a via and a dielectric layer, e.g., interlayer dielectric (ILD) layer. The metallization level may in turn be formed over a substrate. The substrate may include additional front-end-of-line (FEOL) structures or devices fabricated thereon, e.g., an nMOS transistor. In the illustrated embodiment, the metal line of the metallization level includes a metal line that electrically connects the pMOS transistor to the substrate, which may include FEOL structures or devices, e.g., an nMOS transistor. Thus, in the illustrated embodiment, the channel of the pMOS, e.g., a p-channel semiconductor layer, may be formed above and after forming a metallization level, which is in turn formed above and after forming a first transistor, e.g., an nMOS transistor, including a first channel semiconductor layer, which may be formed in a substrate.

Further the illustrated embodiment includes a metallization level including a metal line 420, a via, and a first dielectric layer 430 between the pMOS transistor and the nMOS transistor. The metal line 420 can be a metal interconnect which electrically connects the nMOS transistor and the pMOS transistor, where the metal interconnect is positioned between the pMOS transistor and the nMOS transistor. A second dielectric layer 440 is positioned between the nMOS transistor and the metal interconnect 420. A vertical cross-section of the three-dimensional stack of transistors, from bottom to top, includes the second dielectric layer 440, the metal interconnect 420, the first dielectric layer 430, the p-channel semiconductor layer, the dielectric interlayer, the first dipole forming capping layer, the high-k dielectric layer, and at least one work function metal.

Thus, a sequential 3D stack of CMOS logic tiers can be implemented because reliability can be obtained without resorting to high temperature 'reliability anneals'. A typical reliability anneal of about 850° C. during about is not feasible with a bottom tier BEOL in place.

The stack may comprise pMOS over nMOS or CMOS over CMOS. The gate stack for nMOS may be a LaSiO$_x$ gate stack as discussed before.

A pMOS gate stack in accordance with embodiments of the present disclosure may also be integrated as part of an access transistor or selector of emerging memories (e.g. crossbars).

A pMOS gate stack in accordance with embodiments of the present invention may also be used as a gate stack for thin film transistors, e.g. in displays.

A gate stack in accordance with embodiments of the present invention may also be useful for rearranging the process steps for forming the metal contacts on the source/drain. Nowadays, the source/drain are formed in finFET by epitaxial growth (raised S/D). After growing the source/drain it might be useful to form the metal to semiconductor contact. However, in the prior art this is not possible because it is still required to apply the high thermal budget to fix the gate stack reliability. By doing so, the contacts would degrade under influence of the high thermal budget. As, in embodiments of the present invention, the high-T reliability anneal step can be avoided, a convenient rearrangement of standard RMG HKL integration flow can be implemented. Thereby the contact formation may be done right after S/D fabrication. Thus, "Epi-through-contact" integration is enabled.

What is claimed is:

1. A semiconductor device comprising a p-channel metal-oxide-semiconductor (pMOS) transistor comprising a gate stack, the gate stack comprising:

a silicon oxide dielectric interlayer formed over a substrate, and having a thickness below 1 nm;

a high-k dielectric layer having a higher dielectric constant than the silicon oxide dielectric interlayer;

a first dipole-forming capping layer between the silicon oxide dielectric interlayer and the high-k dielectric layer and in direct contact with the silicon oxide dielectric interlayer, wherein the first dipole-forming capping layer shifts down a high-k bandgap of the high-k dielectric layer relative to a valence band of the substrate and compared to a high-k bandgap in a gate stack that is the same as the gate stack but without the first dipole-forming capping layer, and wherein the first dipole-forming capping layer has a thickness below 2 nm; and at least one work function metal above the high-k dielectric layer, wherein the pMOS transistor is formed over a metallization level such that a metal line electrically connecting the pMOS transistor to the substrate is interposed between the pMOS transistor and the substrate in a vertical direction perpendicular to a major surface of the substrate.

2. The semiconductor device of claim 1, wherein the substrate comprises a silicon substrate, a SiGe substrate, a Ge substrate, or a III-V compound substrate.

3. The semiconductor device of claim 2, wherein the silicon oxide dielectric interlayer comprises a SiO$_2$ or SiON layer.

4. The semiconductor device of claim 1, wherein the first dipole-forming capping layer comprises an Al$_2$O$_3$ layer.

5. The semiconductor device of claim 1, wherein the high-k dielectric layer comprises a HfO$_2$ layer.

6. The semiconductor device of claim 1, comprising a complementary metal-oxide-semiconductor (CMOS) device, the CMOS device comprising the pMOS transistor and an n-channel metal-oxide-semiconductor (nMOS) transistor.

7. The semiconductor device of claim 6, wherein the nMOS transistor comprises an nMOS transistor gate stack on an active region of the substrate, and wherein the nMOS transistor gate stack of the nMOS transistor comprises a second dipole-forming capping layer between an interfacial dielectric layer and a second high-k dielectric layer including a second high-k bandgap, wherein the second dipole-forming capping layer shifts up the second high-k bandgap of the nMOS transistor relative to a conduction band of the substrate and compared to a second high-k bandgap in an nMOS transistor gate stack that is the same as the nMOS transistor gate stack but without the second dipole-forming capping layer.

8. The semiconductor device of claim 7, wherein the second dipole-forming capping layer comprises a transition metal oxide layer or a transition metal silicate layer.

9. The semiconductor device of claim 8, wherein the second dipole-forming capping layer of the nMOS transistor comprises La$_x$Si$_y$O$_z$ with x and z greater than zero, and y greater than or equal to 0, wherein the interfacial dielectric layer of the nMOS transistor comprises SiO$_2$ and wherein the second high-k dielectric layer of the nMOS transistor comprises HfO$_2$ and, wherein the silicon oxide dielectric interlayer of the pMOS transistor comprises SiO$_2$, and wherein the high-k dielectric layer of the pMOS transistor comprises HfO$_2$, and wherein the first dipole-forming capping layer of the pMOS transistor comprises Al$_2$O$_3$.

10. The semiconductor device of claim 1, further comprising a three-dimensional stack of transistors, the three-dimensional stack of transistors comprising the pMOS transistor in a first layer, the first layer stacked vertically in a direction substantially perpendicular to a major surface of the substrate over one or more transistors in a second layer.

11. The semiconductor device of claim 10, wherein the gate stack of the pMOS transistor further comprises a semiconductor layer below the silicon oxide dielectric interlayer, and wherein the three-dimensional stack of transistors further comprises:
   a first dielectric layer between the one or more transistors in the second layer and the pMOS transistor;
   a metal interconnect electrically connecting the one or more transistors in the second layer and the pMOS transistor, wherein the metal interconnect is positioned between the first dielectric layer and the one or more transistors in the second layer; and
   a second dielectric layer between the one or more transistors in the second layer and the metal interconnect,
   wherein a vertical cross-section of the three-dimensional stack of transistors further comprises, from bottom to top, the second dielectric layer, the metal interconnect, the first dielectric layer, the semiconductor layer, the silicon oxide dielectric interlayer, the first dipole-forming capping layer, the high-k dielectric layer, and the at least one work function metal.

12. The semiconductor device of claim 1, wherein the pMOS transistor is formed in a back-end-of-line of the semiconductor device.

13. The semiconductor device of claim 1, wherein the pMOS transistor is formed on or over a memory array.

14. The semiconductor device of claim 1, wherein the gate stack does not include a silicon layer.

15. The semiconductor device of claim 1, wherein the metal line electrically connects the pMOS transistor with an nMOS transistor formed on the substrate.

16. A method of fabricating a semiconductor device, wherein the semiconductor device is a complementary metal oxide semiconductor (CMOS) device, the method comprising:
   forming a p-channel metal-oxide-semiconductor (pMOS) gate stack, wherein forming the pMOS gate stack comprises:
      forming a dielectric interlayer comprising silicon oxide having a thickness below 1 nm on a substrate;
      depositing a first dipole-forming capping layer with a thickness below 2 nm in direct contact with the dielectric interlayer;
      depositing a high-k dielectric layer above the first dipole-forming capping layer having a high-k bandgap, wherein the first dipole-forming capping layer shifts down the high-k bandgap relative to a valence band of the substrate and compared to a high-k bandgap in a gate stack that is the same as the pMOS gate stack but without the first dipole-forming capping layer; and
      depositing one or more work function metals above the high-k dielectric layer; and
   forming an n-channel metal-oxide semiconductor (nMOS) transistor gate stack, wherein forming the nMOS transistor gate stack comprises:
      forming a dielectric interlayer with a thickness below 1 nm on the substrate for the nMOS transistor gate stack, while forming the dielectric interlayer for the pMOS gate stack;
      depositing a second dipole-forming capping layer above the dielectric interlayer for the nMOS transistor gate stack and above the first dipole-forming capping layer for the pMOS transistor gate stack;
      depositing a high-k dielectric layer of the nMOS transistor gate stack above the second dipole-forming capping layer of the nMOS transistor gate stack, while depositing the high-k dielectric layer of the pMOS gate stack, wherein the second dipole-forming capping layer shifts up the high-k bandgap with relation to the conduction band of the substrate; and
      depositing one or more work function metals for the nMOS transistor gate stack.

17. A method of fabricating a semiconductor device, wherein the semiconductor device comprises a three-dimensional stack of transistors, the method comprising repeating the method of claim 16 to form multiple pMOS transistor gate stacks in a plurality of layers of the three-dimensional stack of transistors.

18. The method of claim 16, wherein fabricating the semiconductor device comprises completing fabrication without subjecting the pMOS gate stack to a temperature greater than 800° C. after forming the pMOS gate stack.

19. A semiconductor device comprising a three-dimensional stack of transistors comprising:
   a pMOS transistor comprising:
      a silicon oxide dielectric interlayer formed over a semiconductor layer, and having a thickness below 1 nm;
      a high-k dielectric layer having a higher dielectric constant than the dielectric interlayer;
      a first dipole-forming capping layer between the dielectric interlayer and the high-k dielectric layer and in direct contact with the dielectric interlayer, for shifting down a high-k bandgap of the high-k dielectric layer with relation to a valence band of the semiconductor layer, wherein the first dipole-forming capping layer has a thickness below 2 nm; and
      at least one work function metal above the high-k dielectric layer;
   an nMOS transistor above a substrate and below the pMOS transistor;
   a first dielectric layer between the nMOS transistor and pMOS transistor;
   a metal interconnect electrically connecting the nMOS transistor and the pMOS transistor, wherein the metal interconnect is positioned between the pMOS transistor and the nMOS transistor; and
   a second dielectric layer between the nMOS transistor and the metal interconnect,
   wherein a vertical cross-section of the three-dimensional stack of transistors comprises, from bottom to top, the second dielectric layer, the metal interconnect, the first dielectric layer, the semiconductor layer, the dielectric interlayer, the first dipole-forming capping layer, the high-k dielectric layer, and the at least one work function metal, and
   wherein the metal interconnect electrically connects the at least one work function metal of the pMOS transistor to a gate electrode of the nMOS transistor.

20. The semiconductor device of claim 19, wherein the semiconductor layer comprises silicon, SiGe, Ge, or a III-V compound semiconductor.

21. A method of fabricating a semiconductor device comprising a three-dimensional stack of transistors, the method comprising:

forming a p-channel metal-oxide-semiconductor (pMOS) gate stack, wherein forming the pMOS gate stack comprises:

forming a dielectric interlayer comprising silicon oxide having a thickness below 1 nm on a substrate;

depositing a first dipole-forming capping layer with a thickness below 2 nm in direct contact with the dielectric interlayer;

depositing a high-k dielectric layer above the first dipole-forming capping layer having a high-k bandgap, wherein the first dipole-forming capping layer shifts down the high-k bandgap relative to a valence band of the substrate and compared to a high-k bandgap in a gate stack that is the same as the pMOS gate stack but without the first dipole-forming capping layer; and depositing one or more work function metals above the high-k dielectric layer; and repeating forming the pMOS gate stack to form multiple pMOS transistor gate stacks in a plurality of layers of the three-dimensional stack of transistors.

22. The method of claim 21, wherein the semiconductor device is a complementary metal oxide semiconductor (CMOS) device, the method further comprising providing an nMOS transistor gate stack.

23. The method of claim 21, wherein fabricating the semiconductor device comprises completing fabrication without subjecting the pMOS gate stack to a temperature greater than 800° C. after forming the pMOS gate stack.

24. A method of fabricating a semiconductor device, the method comprising:

forming a p-channel metal-oxide-semiconductor (pMOS) gate stack, wherein forming the pMOS gate stack comprises:

forming a dielectric interlayer comprising silicon oxide having a thickness below 1 nm on a substrate;

depositing a first dipole-forming capping layer with a thickness below 2 nm in direct contact with the dielectric interlayer;

depositing a high-k dielectric layer above the first dipole-forming capping layer having a high-k bandgap, wherein the first dipole-forming capping layer shifts down the high-k bandgap relative to a valence band of the substrate and compared to a high-k bandgap in a gate stack that is the same as the pMOS gate stack but without the first dipole-forming capping layer; and depositing one or more work function metals above the high-k dielectric layer, wherein fabricating the semiconductor device comprises completing fabrication without subjecting the pMOS gate stack to a temperature greater than 800° C. after forming the pMOS gate stack.

25. The method of claim 24, wherein the semiconductor device is a complementary metal oxide semiconductor (CMOS) device, the method further comprising providing an nMOS transistor gate stack.

\* \* \* \* \*